US011994906B2

United States Patent
Franklin et al.

(10) Patent No.: US 11,994,906 B2
(45) Date of Patent: *May 28, 2024

(54) FLEXIBLE ELECTRONIC DEVICES

(71) Applicant: Apple Inc., Cupertino, CA (US)

(72) Inventors: Jeremy C. Franklin, San Francisco, CA (US); Scott A. Myers, Saratoga, CA (US); Benjamin M. Rappoport, Santa Barbara, CA (US); Stephen Brian Lynch, Portola Valley, CA (US); John P. Ternus, Los Altos Hills, CA (US); Justin R. Wodrich, Los Gatos, CA (US)

(73) Assignee: Apple Inc., Cupertino, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/304,285

(22) Filed: Apr. 20, 2023

(65) Prior Publication Data

US 2023/0259163 A1 Aug. 17, 2023

Related U.S. Application Data

(63) Continuation of application No. 16/986,091, filed on Aug. 5, 2020, now Pat. No. 11,675,390, which is a (Continued)

(51) Int. Cl.
G06F 1/16 (2006.01)
G06F 1/3234 (2019.01)
(Continued)

(52) U.S. Cl.
CPC .......... G06F 1/1626 (2013.01); G06F 1/163 (2013.01); G06F 1/1652 (2013.01);
(Continued)

(58) Field of Classification Search
CPC ...... G06F 1/1626; G06F 1/163; G06F 1/1652; G06F 1/1677; G06F 3/0412;
(Continued)

(56) References Cited

U.S. PATENT DOCUMENTS 4,066,855 A 1/1978 Zenk
4,085,302 A 4/1978 Zenk et al.
(Continued)

FOREIGN PATENT DOCUMENTS

CN 1140271 A 1/1997
CN 1744903 A 3/2006
(Continued)

OTHER PUBLICATIONS

Concise Description of Relevance of United States Patent Publication No. US 2007-0202917 Submitted Under 35 U.S.C. § 122(E) and 37 C.F.R. § 1.290 submitted Mar. 19, 2013, for U.S. Appl. No. 13/171,295, filed Jun. 28, 2011, 3 pages.
(Continued)

Primary Examiner — Forrest M Phillips
(74) Attorney, Agent, or Firm — Treyz Law Group, P.C.; Kendall P. Woodruff

(57) ABSTRACT

Flexible electronic devices may be provided. A flexible electronic device may include a flexible display, a flexible housing and one or more flexible internal components configured to allow the flexible electronic device to be deformed. Flexible displays may include flexible display layers, flexible touch-sensitive layers, and flexible display cover layers. The flexible housing may be a multi-stable flexible housing having one or more stable positions. The flexible housing may include a configurable support structure that, when engaged, provides a rigid support structure for the flexible housing. The flexible internal components may include flexible batteries, flexible printed circuits or
(Continued)

other flexible components. A flexible battery may include flexible and rigid portions or may include a lubricious separator layer that provides flexibility for the flexible battery. A flexible printed circuit may include flexible and rigid portions or openings that allow some rigid portions to flex with respect to other rigid portions.

19 Claims, 25 Drawing Sheets

Related U.S. Application Data continuation of application No. 16/421,886, filed on May 24, 2019, now Pat. No. 10,739,908, which is a continuation of application No. 15/974,545, filed on May 8, 2018, now Pat. No. 10,318,061, which is a continuation of application No. 15/419,730, filed on Jan. 30, 2017, now Pat. No. 9,971,448, which is a continuation of application No. 15/055,432, filed on Feb. 26, 2016, now Pat. No. 9,557,874, which is a continuation of application No. 14/589,712, filed on Jan. 5, 2015, now Pat. No. 9,274,562, which is a continuation of application No. 13/250,227, filed on Sep. 30, 2011, now Pat. No. 8,929,085.

(51) Int. Cl.
| | | |
|---|---|---|
| G06F 3/041 | (2006.01) | |
| G06F 3/044 | (2006.01) | |
| G09G 3/00 | (2006.01) | |
| G09G 3/20 | (2006.01) | |
| G09G 3/3208 | (2016.01) | |
| H01M 10/04 | (2006.01) | |
| H01M 50/105 | (2021.01) | |
| H01M 50/213 | (2021.01) | |
| H01M 50/216 | (2021.01) | |
| H01M 50/293 | (2021.01) | |
| H01M 50/409 | (2021.01) | |
| H01M 50/469 | (2021.01) | |
| H04M 1/02 | (2006.01) | |
| H10K 59/40 | (2023.01) | |
| H10K 77/10 | (2023.01) | |
| H10K 102/00 | (2023.01) | |

(52) U.S. Cl.
CPC .......... *G06F 1/1677* (2013.01); *G06F 1/3265* (2013.01); *G06F 3/0412* (2013.01); *G06F 3/0416* (2013.01); *G06F 3/044* (2013.01); *G09G 3/035* (2020.08); *G09G 3/20* (2013.01); *G09G 3/2092* (2013.01); *G09G 3/3208* (2013.01); *H01M 10/0436* (2013.01); *H01M 50/213* (2021.01); *H01M 50/216* (2021.01); *H01M 50/293* (2021.01); *H04M 1/0268* (2013.01); *H10K 59/40* (2023.02); *H10K 77/111* (2023.02); *G06F 2203/04101* (2013.01); *G06F 2203/04102* (2013.01); *G06F 2203/04103* (2013.01); *G06F 2203/04105* (2013.01); *G09G 2330/027* (2013.01); *H01M 50/105* (2021.01); *H01M 50/409* (2021.01); *H01M 50/469* (2021.01); *H01M 2220/30* (2013.01); *H04M 1/0216* (2013.01); *H04M 1/0262* (2013.01); *H10K 2102/311* (2023.02); *Y02D 10/00* (2018.01); *Y02E 10/549* (2013.01)

(58) Field of Classification Search
CPC ....... G06F 3/0416; G06F 3/044; G09G 3/035; G09G 3/20; G09G 3/2092; G09G 3/3208; H01M 50/293; H01M 50/216; H01M 50/213; H01M 10/0436; H01K 59/40; H01K 77/111

See application file for complete search history.

(56) References Cited

U.S. PATENT DOCUMENTS

| | | | |
|---|---|---|---|
| 5,483,261 | A | 1/1996 | Yasutake |
| 5,488,204 | A | 1/1996 | Mead et al. |
| 5,825,352 | A | 10/1998 | Bisset et al. |
| 5,835,079 | A | 11/1998 | Shieh |
| 5,880,411 | A | 3/1999 | Gillespie et al. |
| 6,188,391 | B1 | 2/2001 | Seely et al. |
| 6,243,075 | B1 | 6/2001 | Fishkin et al. |
| 6,297,838 | B1 | 10/2001 | Chang et al. |
| 6,310,610 | B1 | 10/2001 | Beaton et al. |
| 6,323,846 | B1 | 11/2001 | Westerman et al. |
| 6,563,927 | B2 | 5/2003 | Mote et al. |
| 6,690,387 | B2 | 2/2004 | Zimmerman et al. |
| 6,803,245 | B2 | 10/2004 | Auch et al. |
| 6,897,850 | B2 | 5/2005 | Sugimoto |
| 7,015,894 | B2 | 3/2006 | Morohoshi |
| 7,034,913 | B2 | 4/2006 | Ishida |
| 7,082,196 | B2 | 7/2006 | Kauhaniemi et al. |
| 7,130,004 | B2 | 10/2006 | Kela et al. |
| 7,184,064 | B2 | 2/2007 | Zimmerman et al. |
| 7,242,315 | B2 | 7/2007 | Affolter et al. |
| 7,541,671 | B2 | 6/2009 | Foust et al. |
| 7,558,594 | B2 | 7/2009 | Wilson |
| 7,663,607 | B2 | 2/2010 | Hotelling et al. |
| 7,782,274 | B2 | 8/2010 | Manning |
| 7,834,451 | B2 | 11/2010 | Lee et al. |
| 8,502,788 | B2 | 8/2013 | Cho |
| 8,508,433 | B2 | 8/2013 | Manning |
| 8,581,859 | B2 | 11/2013 | Okumura et al. |
| 8,669,918 | B2 | 3/2014 | Manning |
| 8,723,824 | B2 | 5/2014 | Myers et al. |
| 8,724,304 | B2 | 5/2014 | Raff et al. |
| 8,787,016 | B2 * | 7/2014 | Rothkopf ............ H04M 1/0268 361/679.55 |
| 8,804,347 | B2 | 8/2014 | Martisauskas et al. |
| 8,816,977 | B2 | 8/2014 | Rothkopf et al. |
| 8,929,085 | B2 * | 1/2015 | Franklin ............... G06F 1/1677 361/749 |
| 9,007,300 | B2 * | 4/2015 | Hirsch .................. G06F 1/1652 345/156 |
| 9,274,562 | B2 | 3/2016 | Franklin et al. |
| 9,557,874 | B2 | 1/2017 | Franklin et al. |
| 11,675,390 | B2 * | 6/2023 | Franklin ............. H01M 50/216 345/174 |
| 2001/0048413 | A1 | 12/2001 | Tabata |
| 2002/0001187 | A1 | 1/2002 | Murofushi |
| 2002/0180344 | A1 | 12/2002 | Lichtfuss |
| 2003/0227441 | A1 | 12/2003 | Hioki et al. |
| 2004/0217877 | A1 | 11/2004 | Kokonaski et al. |
| 2004/0227147 | A1 | 11/2004 | Affolter et al. |
| 2005/0025330 | A1 | 2/2005 | Saiki et al. |
| 2005/0140646 | A1 | 6/2005 | Nozawa |
| 2006/0026521 | A1 | 2/2006 | Hotelling et al. |
| 2006/0038745 | A1 * | 2/2006 | Naksen .................. G06F 1/1624 257/40 |
| 2006/0050475 | A1 | 3/2006 | Chen |
| 2006/0197753 | A1 | 9/2006 | Hotelling |
| 2006/0238494 | A1 | 10/2006 | Narayanaswami |
| 2006/0273304 | A1 | 12/2006 | Cok |
| 2007/0202917 | A1 | 8/2007 | Phelps |
| 2007/0242033 | A1 | 10/2007 | Cradick et al. |
| 2007/0247422 | A1 | 10/2007 | Vertegaal et al. |
| 2007/0258604 | A1 | 11/2007 | Bosnecker |
| 2008/0068519 | A1 | 3/2008 | Adler et al. |
| 2008/0204367 | A1 * | 8/2008 | Lafarre ............... H04M 1/0268 345/55 |
| 2008/0291225 | A1 | 11/2008 | Arneson |
| 2008/0305838 | A1 | 12/2008 | Joo |
| 2009/0167171 | A1 | 7/2009 | Jung et al. |
| 2009/0219247 | A1 | 9/2009 | Watanabe et al. |
| 2009/0256471 | A1 | 10/2009 | Kim et al. |

(56) References Cited

U.S. PATENT DOCUMENTS

| | | | |
|---|---|---|---|
| 2010/0011291 A1 | 1/2010 | Nurmi | |
| 2010/0026952 A1 | 2/2010 | Miura et al. | |
| 2010/0045705 A1 | 2/2010 | Vertegaal et al. | |
| 2010/0060548 A1 | 3/2010 | Choi et al. | |
| 2010/0060664 A1 | 3/2010 | Kilpatrick, II et al. | |
| 2010/0073593 A1 | 3/2010 | Sasaki | |
| 2010/0117975 A1* | 5/2010 | Cho | G06F 3/04883 345/173 |
| 2010/0120470 A1 | 5/2010 | Kim et al. | |
| 2010/0164888 A1 | 7/2010 | Okumura | |
| 2010/0328845 A1 | 10/2010 | Hiralal et al. | |
| 2010/0315399 A1 | 12/2010 | Jacobson et al. | |
| 2011/0086680 A1 | 4/2011 | Kim et al. | |
| 2011/0187681 A1 | 8/2011 | Kim et al. | |
| 2011/0227822 A1 | 9/2011 | Shai | |
| 2012/0127087 A1* | 5/2012 | Ma | G06F 1/1652 345/173 |
| 2012/0218219 A1 | 8/2012 | Rappoport et al. | |
| 2012/0242588 A1 | 9/2012 | Myers et al. | |
| 2012/0243151 A1 | 9/2012 | Lynch | |
| 2012/0243719 A1 | 9/2012 | Franklin et al. | |
| 2013/0021289 A1 | 1/2013 | Chen et al. | |
| 2013/0081756 A1 | 4/2013 | Franklin et al. | |
| 2013/0082984 A1 | 4/2013 | Drzaic et al. | |
| 2013/0083491 A1 | 4/2013 | Rappoport et al. | |
| 2013/0094126 A1 | 4/2013 | Rappoport et al. | |
| 2013/0140965 A1 | 6/2013 | Franklin et al. | |
| 2015/0011248 A1 | 1/2015 | Vartanian | |

FOREIGN PATENT DOCUMENTS

| | | |
|---|---|---|
| CN | 1254665 C | 5/2006 |
| CN | 2862088 Y | 1/2007 |
| CN | 101548531 A | 9/2009 |
| CN | 101674361 A | 3/2010 |
| CN | 101782804 A | 7/2010 |
| CN | 101788850 A | 7/2010 |
| DE | 10324143 A1 | 12/2004 |
| EP | 0899650 A2 | 3/1999 |
| EP | 0929027 A2 | 7/1999 |
| EP | 2315186 A1 | 4/2011 |
| JP | H0666969 A | 3/1994 |
| JP | H10171620 A | 6/1998 |
| JP | H10256740 A | 9/1998 |
| JP | H11143606 A | 5/1999 |
| JP | 2000163031 A | 6/2000 |
| JP | 2000293117 A | 10/2000 |
| JP | 2001061194 A | 3/2001 |
| JP | 2001154592 A | 6/2001 |
| JP | 2001189978 A | 7/2001 |
| JP | 2002232992 A | 8/2002 |
| JP | 2002342033 A | 11/2002 |
| JP | 2003015795 A | 1/2003 |
| JP | 2003-076442 A | 3/2003 |
| JP | 2003125315 A | 4/2003 |
| JP | 2003179988 A | 6/2003 |
| JP | 2003211087 A | 7/2003 |
| JP | 2003280546 A | 10/2003 |
| JP | 2003280548 A | 10/2003 |
| JP | 2004173264 A | 6/2004 |
| JP | 2005091873 A | 4/2005 |
| JP | 2005110216 A | 4/2005 |
| JP | 2006174506 A | 6/2006 |
| JP | 2007272107 A | 10/2007 |
| JP | 2008233779 A | 10/2008 |
| JP | 2008283350 A | 11/2008 |
| JP | 2009-205565 A | 9/2009 |
| JP | 2010008480 A | 1/2010 |
| JP | 2010191246 A | 9/2010 |
| JP | 2010-288272 A | 12/2010 |
| KR | 20040088265 A | 10/2004 |
| KR | 10-0867608 B | 10/2008 |
| KR | 20100052227 A | 5/2010 |
| KR | 20110028650 A | 3/2011 |
| KR | 10-20111-0048640 A | 5/2011 |
| KR | 1020110046886 A | 5/2011 |
| KR | 1020110048640 A | 5/2011 |
| WO | 0008826 A1 | 2/2000 |
| WO | 2010144366 A1 | 12/2010 |

OTHER PUBLICATIONS

Concise Description of Relevance of United States Patent Publication No. US 2008-0305838 Submitted Under 35 U.S.C. § 122(E) and 37 C.F.R. § 1.290 submitted Mar. 19, 2013, for U.S. Appl. No. 13/171,298, filed Jun. 28, 2011, 3 pages.

Concise Description of Relevance of United States Patent Publication No. US 2006-0238494 Submitted Under 35 U.S.C. § 122(E) and 37 C.F.R. § 1.290 submitted Mar. 19, 2013, for U.S. Appl. No. 13/171,298, filed Jun. 28, 2011, 3 pages.

Concise Description of Relevance of United States Patent Publication No. US 2003-0227441 Submitted Under 35 U.S.C. § 122(E) and 37 C.F.R. § 1.290 submitted Mar. 19, 2013, for U.S. Appl. No. 13/171,298, filed Jun. 28, 2011, 3 pages.

Concise Description of Relevance of Japanese Patent Publication No. JP 2003-211087 Submitted Under 35 U.S.C. § 122(E) and 37 C.F.R. § 1.290 submitted Mar. 19, 2013, for U.S. Appl. No. 13/171,298, filed Jun. 28, 2011, 3 pages.

Patent Cooperation Treaty Third Party Observation submitted Jun. 14, 2013, for International Patent Application No. PCT/2012/029844 filed on Mar. 20, 2012, 6 pages.

Patent Cooperation Treaty Third Party Observation submitted Jun. 14, 2013, for International Patent Application No. PCT/2012/029844 filed on Mar. 20, 2012, 4 pages.

Patent Cooperation Treaty Third Party Observation submitted Jun. 14, 2013, for International Patent Application No. PCT/2012/029844 filed on Mar. 20, 2012, 3 pages.

Concise Description of Relevance of Japanese Patent Publication No. JP 2001-154592 Submitted Under 35 U.S.C. § 122(E) and 37 C.F.R. § 1.290 submitted Mar. 19, 2013, for U.S. Appl. No. 13/184,303, filed Jul. 15, 2011, 5 pages.

Concise Description of Relevance of Japanese Patent Publication No. HEI6-66969 Submitted Under 35 U.S.C. § 122 (E) and 37 C.F.R. § 1.290 submitted Mar. 19, 2013, for U.S. Appl. No. 13/184,303, filed Jul. 15, 2011, 3 pages.

Concise Description of Relevance of Japanese Patent Publication No. JP 2003-280548 Submitted Under 35 U.S.C. § 122(E) and 37 C.F.R. § 1.290 submitted Mar. 19, 2013, for U.S. Appl. No. 13/184,303, filed Jul. 15, 2011, 4 pages.

Concise Description of Relevance of Japanese Patent Publication No. JP 2000-293117 Submitted Under 35 U.S.C. § 122(E) and 37 C.F.R. § 1.290 submitted Mar. 19, 2013, for U.S. Appl. No. 13/184,303, filed Jul. 15, 2011, 3 pages.

Concise Description of Relevance of Japanese Patent Publication No. JP 2010-008480 Submitted Under 35 U.S.C. § 122(E) and 37 C.F.R. § 1.290 submitted Mar. 19, 2013, for U.S. Appl. No. 13/184,303, filed Jul. 15, 2011, 5 pages.

Author: unknown, "The Nokia Morph Concept", Nokia Symbian Themes, Wireless News [online], Feb. 25, 2008 [retrieved on Jun. 21, 2012] Retrieved from the Internet: http://www.nokiasymbianthemes.com/explore/the-nokia-morph-concept.

Thrystan, "Nokia Morph Concept Phone Revealed Today", Concept Phones [online], Apr. 17, 2008 [retrieved on Jun. 21, 2012] Retrieved from the Internet: http://www.concept-phones.com/nokia/nokia-morph-concept-phone-revealed-today.

Thrystan, "Nokia Flexible Kinetic Device Shown at Nokia World 2011", Concept Phones [online], Oct. 26, 2011 [retrieved on Jun. 21, 2012] Retrieved from the Internet: http://www.concept-phones.com/nokia/nokia-morph-concept-phone-revealed-today.

Smith, "Nokia's kinetic future: flexible screens and a twisted interface" (video), Engadget [online], Oct. 26, 2011 [retrieved on Jun. 21, 2012] Retrieved from the Internet: http://www.engadget.com/2011/10/26/nokias-kinetic-future-flexible-screens-and-a-twisted-interface.

(56) References Cited

OTHER PUBLICATIONS

Malykhina, "Nokia Uses Nano Tech For 'Morph' Concept Cell Phone", InformationWeek [online], Feb. 25, 2008 [retrieved on Jun. 21, 2012] Retrieved from the Internet: http://www.informationweek.com/news/206801722.

* cited by examiner

FLEXIBLE ELECTRONIC DEVICES

This application is a continuation of U.S. patent application Ser. No. 16/986,091, filed Aug. 5, 2020, which is a continuation of U.S. patent application Ser. No. 16/421,886, filed May 24, 2019, now U.S. Pat. No. 10,739,908, which is a continuation of U.S. patent application Ser. No. 15/974,545, filed May 8, 2018, now U.S. Pat. No. 10,318,061, which is a continuation of U.S. patent application Ser. No. 15/419,730, filed Jan. 30, 2017, now U.S. Pat. No. 9,971,448, which is a continuation of U.S. patent application Ser. No. 15/055,432, filed Feb. 26, 2016, now U.S. Pat. No. 9,557,874, which is a continuation of U.S. patent application Ser. No. 14/589,712, filed Jan. 5, 2015, now U.S. Pat. No. 9,274,562, which is a continuation of U.S. patent application Ser. No. 13/250,227, filed Sep. 30, 2011, now U.S. Pat. No. 8,929,085, all of which are hereby incorporated by reference herein in their entireties.

BACKGROUND

This relates generally to electronic devices, and more particularly, to flexible electronic devices.

Electronic devices such as portable computers and cellular telephones are often provided with rigid components. Rigid components often include rigid housing structures, rigid displays such as liquid crystal displays (LCDs), rigid display cover layers formed from plastic or glass, rigid internal components such as rigid printed circuit boards, batteries, other electrical components or other rigid structural components. Electronic devices are commonly designed to have a rigid exterior structure.

Flexible display technologies are available that allow displays to be flexed. For example, flexible displays may be formed using flexible organic light-emitting diode (OLED) display technology. Electronic devices with flexible display are commonly provided with rigid housing structures or other rigid structures that form a rigid electronic device.

Rigid electronic devices may be vulnerable to damage in the event of an impact such as a drop of the device on a hard surface.

It would therefore be desirable to be able to provide improved electronic devices.

SUMMARY

Electronic devices may be provided that have portions that are capable of being flexed.

Flexible electronic devices may include flexible housing members and flexible internal components. A flexible housing member may include a flexible device housing. Rigid and flexible internal components may be mounted in the flexible housing. Flexible internal components may include a flexible display such as an Organic Light Emitting Diode (OLED) display. A flexible display may be mounted to a flexible display cover layer. A flexible display cover layer may be mounted to a flexible device housing. Flexible internal components may include flexible circuit boards such as printed circuits having one or more flexible portions and integrated circuits that are formed on a flexible substrate. Flexible internal components may include flexible batteries such as batteries having rigid and flexible portions, batteries formed from multiple rigid portions joined in a flexible joint, and batteries formed from flexible battery layers.

Flexible housing members may include housing members with rigid and flexible portions, or housing members that are substantially all flexible. Flexible housing members may include hinges or elastomeric portions that allow the flexible housing members to flex. Flexible housing members may have portions that provide flexibility in one dimension and other portions that provide rigidity in another dimension. Flexible housing members may have one or more multistable flex regions such as bi-stable flex regions for providing two or more stable configurations for the flexible electronic device.

Flexible housing members may include configurable internal support structures that have flexible and rigid configurations. Flexible housing members may include fluid filled or air filled pockets for alternately stiffening and flexing the device.

Flexible electronic devices may include flex sensing components for sensing deformations of the flexible electronic device. Deformations of the flexible electronic device that are sensed by flex sensing components may provide user input to the electronic device. For example, twisting a flexible electronic device may change the operating mode of the device, may be interpreted by the device as a command to an electronic gaming system, may turn the device on or off, etc.

Flexible electronic devices may be more resistant to damage during impact events such as drops because the flexible device may bend or deform while absorbing the impact. Deformation of this type may increase the duration of an impact thereby reducing the impulse received by other components of the flexible device.

Further features of the invention, its nature and various advantages will be more apparent from the accompanying drawings and the following detailed description.

DETAILED DESCRIPTION

Figure 1:
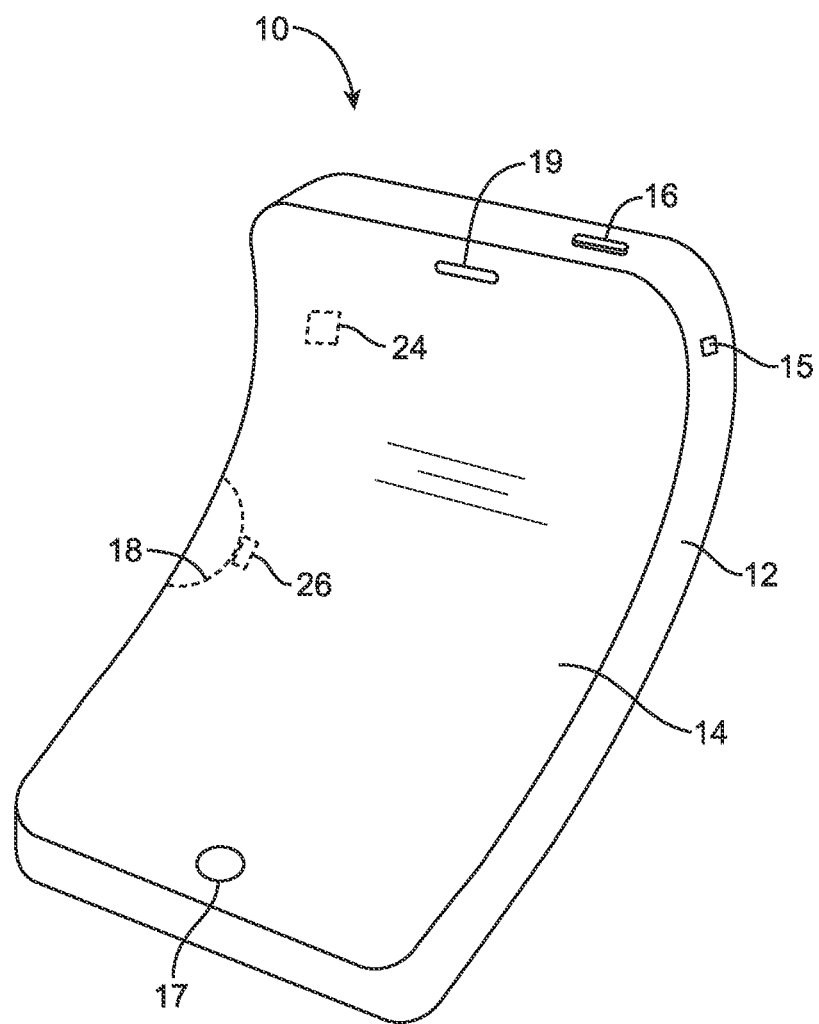
FIG. 1 is a perspective view of an illustrative flexible electronic device in accordance with an embodiment of the present invention.

A flexible electronic device may be provided with flexible internal and external components that allow the device to be flexible. The flexible internal components may include a flexible display, flexible batteries, flexible circuit boards or other flexible electrical or support components.

Flexible exterior components may include a flexible display cover layer, a flexible housing or other flexible external components. Flexible interior and exterior components may have regions of relatively more flexibility and regions of relatively less flexibility. Flexible devices may have portions of relatively more flexibility and portions of relatively less flexibility. Flexible devices may be relatively more flexible in one dimension than in another dimension.

Flexible displays may be formed from flexible layers such as a flexible display layer (e.g., a flexible organic light-emitting diode array), a flexible touch-sensitive layer (e.g., a sheet of polymer with an array of transparent capacitor electrodes for a capacitive touch sensor), a flexible substrate layer, etc. These flexible layers may, if desired, be covered by a flexible cover layer (e.g., a flexible plastic or flexible thin glass layer) or may be supported by a flexible support structure (e.g., a flexible support structure on the underside of the flexible layers).

Cover layers may be provided with openings that provide access to the flexible layers of the display. For example, a cover layer may have an opening that allows a button member to move relative to the cover glass layer. As the button member moves within the opening, underlying portions of the flexible display may be deformed (e.g., to allow actuation of an associated switch).

Electronic devices may also be provided with user interface components (input-output components) such as buttons, microphones, speakers, piezoelectric actuators or (for receiving electrical input from a user or tactile feedback to users), other actuators such as vibrators, pressure sensors, and other components. These components may be mounted under portions of a flexible display.

User interface components may be mounted under the flexible display or may be integrated into the flexible display. The deformable nature of the flexible display may allow a user to interact with the user interface components (input-output components) by moving the display into contact with the user interface components or by otherwise allowing the display to locally flex (e.g., to allow sound to pass through the flexible display or to allow barometric pressure measurements of the exterior environment to be made by an internal pressure sensor). If desired, a portion of the flexible display may form a membrane portion of an electrical component. Components that may be provided with a membrane that is formed from a portion of a flexible display include microphones, laser microphones, pressure sensors, speakers, etc.

User interface components may be configured to detect deformations of all or part of the electronic device. Deformations detected by user interface components may be interpreted by processing software associated with the device as user inputs to the device.

As an example, a flexible device may be foldable so that the device may be folded for storage (e.g., in a pocket). User interface components may be configured to sense that a device has been folded and to cause the device to enter a standby or off mode. User interface components may be configured to sense inactive deformations of the device (e.g., a folded or open position of the device) or may be configured to detect active deformations of the device (e.g., active twisting, squeezing, bending or otherwise active deforming) of the device.

As another example, user interface components may be configured to detect a twist of a flexible electronic device.

User interface components may be configured to initiate a response from the device to the detected twist such as turning the device on or off, entering active or standby mode, answering a cellular telephone call, starting a software application, changing a volume associated with audio or video playback of media, starting or stopping audio playback of media, etc.

An illustrative flexible electronic device of the type that may be provided with flexible interior and exterior components that allow the device to bend is shown in FIG. 1. Electronic device 10 may be a portable electronic device or other suitable electronic device. For example, electronic device 10 may be a laptop computer, a tablet computer, a somewhat smaller device such as a wrist-watch device, pendant device, or other wearable or miniature device, a cellular telephone, a media player, etc.

Device 10 may include a flexible housing such as housing 12. Flexible housing 12, which may sometimes be referred to as a case, may be formed of a deformable material such as plastic, thin glass, fiber composites, thin metal (e.g., aluminum, etc.), fabric, silicone, other suitable materials, or a combination of these materials. In some situations, parts of housing 12 may be formed from dielectric or other low-conductivity material. In other situations, housing 12 or at least some of the structures that make up housing 12 may be formed from metal elements.

Housing 12 may be formed from a conformal mold (e.g., soft deformable plastic, silicone or other deformable material that bonds to internal components such as batteries, printed circuits or other components) that conforms to fill available volume in device 10 or housing 12 may be attached to internal components or a display using fasteners, adhesives, welds, or other attachment members or features. Housing 12 may include engagement features for attaching other flexible or rigid components of device 10. Flexible housing 12 may be formed from a single flexible structure formed from a deformable material or may include multiple housing structures formed from a deformable material.

Device 10 may have a flexible display such as flexible display 14. Flexible display 14 may be configured to flex with flexible housing 12 as shown in FIG. 1. Flexible display 14 may be formed from multiple layers of material. These layers may include a touch sensor layer such as a layer on which a pattern of indium tin oxide (ITO) electrodes or other suitable transparent electrodes have been deposited to form a capacitive touch sensor array. These layers may also include a layer that contains an array of display pixels. The touch sensor layer and the display layer may be formed using flexible sheets of polymer or other substrates having thicknesses of 10 microns to 0.5 mm or other suitable thicknesses (as an example).

The display pixel array may be, for example, an organic light-emitting diode (OLED) array containing rows and columns of OLED display pixels. Other types of flexible display pixel arrays may also be formed (e.g., electronic ink displays, etc.). The use of OLED technology to form flexible display 14 is sometimes described herein as an example. This is, however, merely illustrative. Flexible display 14 may be formed using any suitable flexible display technology. The use of flexible displays that are based on OLED technology is merely illustrative.

In addition to these functional display layers (i.e., the OLED array and the optional touch sensor array), display 14 may include one or more structural layers. For example, display 14 may be covered with a flexible cover layer and/or may be mounted on a support structure (e.g., a flexible support). Layers of adhesive may be used in attaching flexible display layers to each other and may be used in mounting flexible display layers to flexible structural layers.

Input-output components may be mounted at any suitable location under the display (e.g., along peripheral portions of the display, in a central portion of the display, etc.). If desired, the cover layer may be provided with one or more openings and the electronic components may be mounted under the openings. For example, a rigid cover layer may have openings for button 17 and a speaker port opening for a speaker such as speaker 19 (e.g., for an ear speaker for a user). Device 10 may also have other openings (e.g., openings in display 14 and/or housing 12 for accommodating volume buttons, ringer buttons, sleep/power buttons such as button 16, and other buttons, openings for switches such as switch 15, openings for an audio jack, data port connectors, removable media slots, etc.).

Buttons 17, 16 and switch 15 may be based on dome switches or other switch circuitry. Buttons 17, 16 and switch 15 may include button members that form push buttons (e.g., momentary buttons), slider switches, rocker switches, etc. Switch 15 may be used to change operational modes of device 10 (e.g., turn a ringer for a cellular telephone on, off, or switch to a vibrate-only mode) or may be used to change a physical characteristic of device 10 (e.g., to switch housing 12 from a flexible to a rigid state using internal stiffening structures). Switch 15 may be an electronic switch or a mechanical switch that engages internal stiffening structures (e.g., an internal locking skeleton, an internal bladder system, an internal configurable support structure, etc.) associated with housing 12.

Device 10 may include components such as interface components 24 and 26 that may be fully internal to device 10, but that receive input from the user or from the surrounding environment through physical interaction with flexible display 14 or other portions of flexible device 10. Interface components 24 and 26 may be positioned underneath flexible display 14 or flexible housing 12 so that flexible display 14 or flexible housing 12 must be deformed in order to contact components 24 or 26 or, if desired may be positioned to remain in constant contact with flexible display 14. Components 24 and 26 may be proximity sensors, pressure sensors, touch sensors (e.g., a portion of touch-sensitive display 14), light sensors, magnetic sensors, capacitive sensors, or other types of sensors configured to sense deformations of one or more portions of device 10.

Interface components 24 and 26 may be positioned so that a deformation of flexible device 10 may activate internal components 24 or 26. For example, interface component 26 may include a switch positioned so that a squeeze of flexible device 10 that deforms flexible housing 12 and flexible display 14 (as indicated by dashed line 18) activates interface component 26 (e.g., by moving a portion of housing 12 into contact with the switch and thereby operating the switch). Interface component 24 may be configured to sense the relative position of interface component 26. Relative positions of internal components such as components 24 and 26 may provide information about the position or active flexing of device 10. Information about the position or about active flexing of device 10 may be used to activate internal components 24 or 26 or may active software applications that run on a processor associated with device 10.

For example, internal component 24 may be configured to sense a distance of internal component 24 from internal component 26. Internal component 24 may be configured to change an operating mode of device 10 when the distance between internal component 24 and internal component 26 falls below or rises above a predetermined threshold (e.g., to put display 14 to sleep when the distance becomes less than the predetermined threshold, to turn display 14 on when the distance rises above the predetermined threshold, to turn device 10 off when the distance becomes less than the predetermined threshold, etc.)

Figure 2:
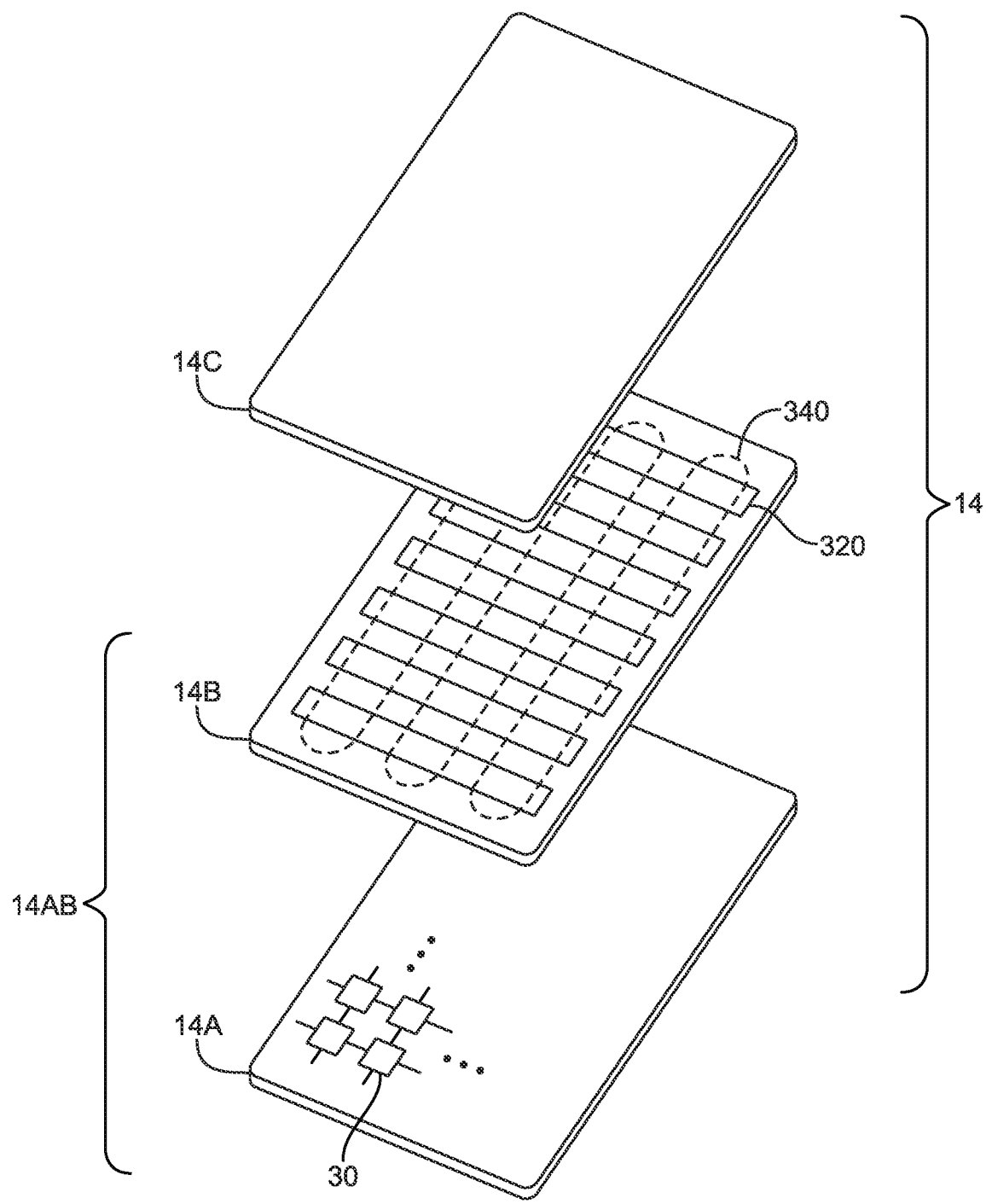
FIG. 2 is a diagram of an illustrative set of display layers that may be used to form a flexible display in accordance with an embodiment of the present invention.

An exploded perspective view of an illustrative display is shown in FIG. 2. As shown in FIG. 2, flexible display 14 may be formed by stacking multiple layers including flexible display layer 14A, touch-sensitive layer 14B, and cover layer 14C. Display 14 may also include other layers of material such as adhesive layers, optical films, or other suitable layers. Flexible display layer 14 may include image pixels formed from light-emitting diodes (LEDs), organic LEDs (OLEDs), plasma cells, electronic ink elements, liquid crystal display (LCD) components, or other suitable image pixel structures compatible with flexible displays.

Touch-sensitive layer 14B may incorporate capacitive touch electrodes such as horizontal transparent electrodes 320 and vertical transparent electrodes 340. Touch-sensitive layer 14B may, in general, be configured to detect the location of one or more touches or near touches on touch-sensitive layer 14B based on capacitive sensors, resistive sensors, optical sensors, acoustic sensors, inductive sensors, or force sensors.

Software and/or hardware may be used to process the measurements of the detected touches to identify and track one or more gestures. A gesture may correspond to stationary or non-stationary, single or multiple, touches or near touches on touch-sensitive layer 14B. A gesture may be performed by moving one or more fingers or other objects in a particular manner on touch-sensitive layer 14B such as tapping, pressing, rocking, scrubbing, twisting, changing orientation, pressing with varying pressure and the like at essentially the same time, contiguously, or consecutively. A gesture may be characterized by, but is not limited to a pinching, sliding, swiping, rotating, flexing, dragging, or tapping motion between or with any other finger or fingers. A single gesture may be performed with one or more hands, by one or more users, or any combination thereof.

Cover layer 14C may be formed from plastic, thin glass (sometimes referred to as display cover glass) or other flexible transparent material. If desired, the interior surface of peripheral inactive portions of cover layer 14C may be provided with an opaque masking layer on such as black ink.

Touch-sensitive flexible display section 14AB may be formed from display pixel array layer 14A and optional touch sensor layer 14B.

Figure 3:
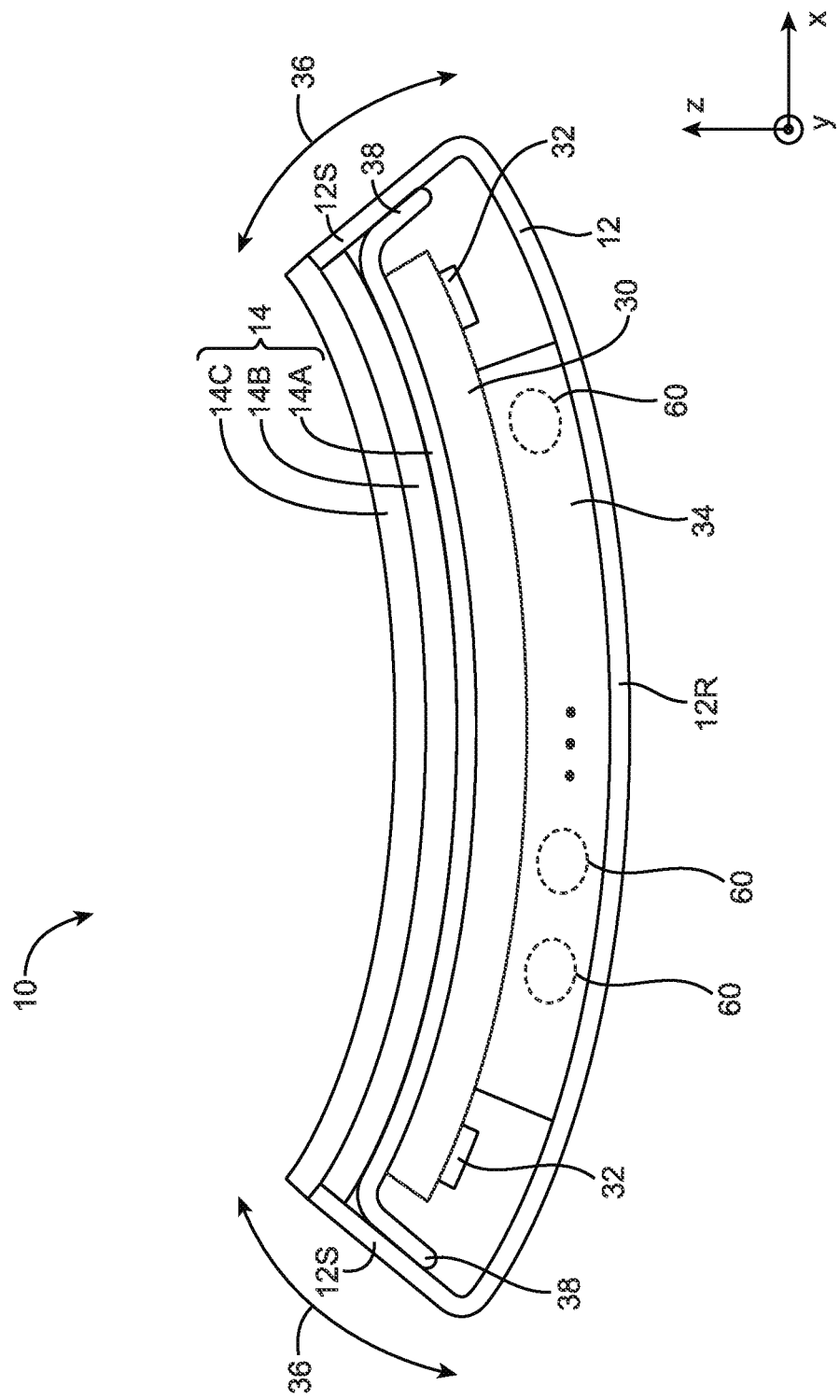
FIG. 3 is a cross-sectional side view of an illustrative flexible electronic device in accordance with an embodiment of the present invention.

FIG. 3 is cross-sectional side view of an illustrative embodiment of device 10 with flexible internal and external components. As shown in FIG. 3, flexible internal and external components of device 10 may include a flexible display such as flexible display 14, a flexible housing such as flexible housing 12, a flexible logic board such as flexible printed circuit 30, and a flexible battery such as flexible battery 34. As shown in FIG. 3, flexible battery 34 may, if desired, include one or more battery cells or battery packs such as charge storage components 60.

Flexible printed circuit 30 may be a flexible printed circuit substrate, a rigid printed circuit board with one or more flexible portions formed from a layer of flexible printed circuit substrate, or a rigid printed circuit board with rigid portions that flex with respect to other rigid portions. Integrated circuits, power management units, storage such as volatile and non-volatile memory, discrete components such as resistors, capacitors, and inductors, and other electronic components 32 may be mounted to flexible printed circuit 30.

Device 10 may be provided with one or more batteries such as battery 34. Battery 34 may be mounted to flexible housing 12, may be mounted to flexible printed circuit 30, or may be otherwise mounted in flexible housing 12.

A device such as device 10 that includes flexible internal and external components may be a flexible device that is able to be flexed or deformed as indicated by arrows 36. Housing 12, display 14, logic board 30 and battery 34 may be configured so that flexible device 10 has one or more preferred positions and so that flexible device 10 returns to one of the preferred positions in the absence of external flexing forces such as flexing forces in the direction of arrows 36. This is merely illustrative. If desired, flexible device 10 may have no preferred position and may be configured to remain in any curved, flexed or substantially flat position.

As shown in FIG. 3, flexible display 14 may include bent sidewall portions 38 that are bent to be mounted adjacent to a flexible housing sidewall such as sidewall portions 12S of housing 12. Housing 12 may include a rear portion such as flexible rear housing wall 12R that provides device 10 with a flexible rear surface. Flexible housing 12, flexible display 14, flexible battery 34 and flexible printed circuit 30 may allow flexible device 10 to be flexed out of, for example, an x-y plane into a z dimension as shown in FIG. 3. Flexible housing 12, flexible display 14, flexible battery 34 and flexible printed circuit 30 may be able to be flexed about an axis that is parallel to the y-axis (shown in FIG. 3), about an axis that is parallel to the x-axis, and/or about an axis that is parallel to the z-axis.

Figure 4:
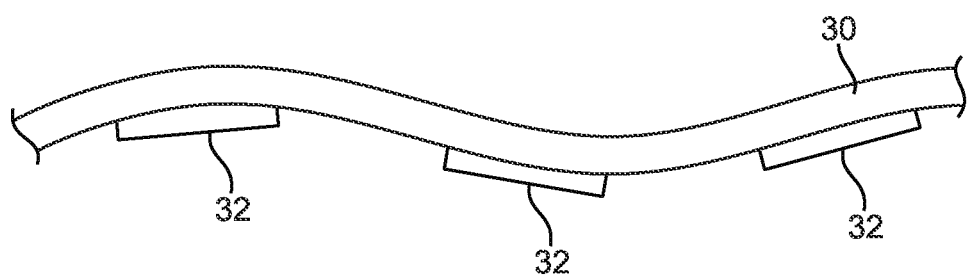
FIG. 4 is a cross-sectional side view of an illustrative flexible main logic board formed from a flexible printed circuit substrate with electrical components in accordance with an embodiment of the present invention.

FIG. 4 shows a cross-sectional side view of a portion of an illustrative flexible printed circuit substrate such as flexible printed circuit 30. As shown in FIG. 4, printed circuit 30 may be formed from a flexible printed circuit (also sometimes referred to herein as a flex circuit). In configurations in which printed circuit 30 is formed from a flex circuit, components 32 may be mounted to flexible portions of printed circuit 30.

Flexible printed circuit 30 may contain patterned conductive traces (e.g., conductive traces on flexible sheets of substrate such as polyimide sheets).

Figure 5:
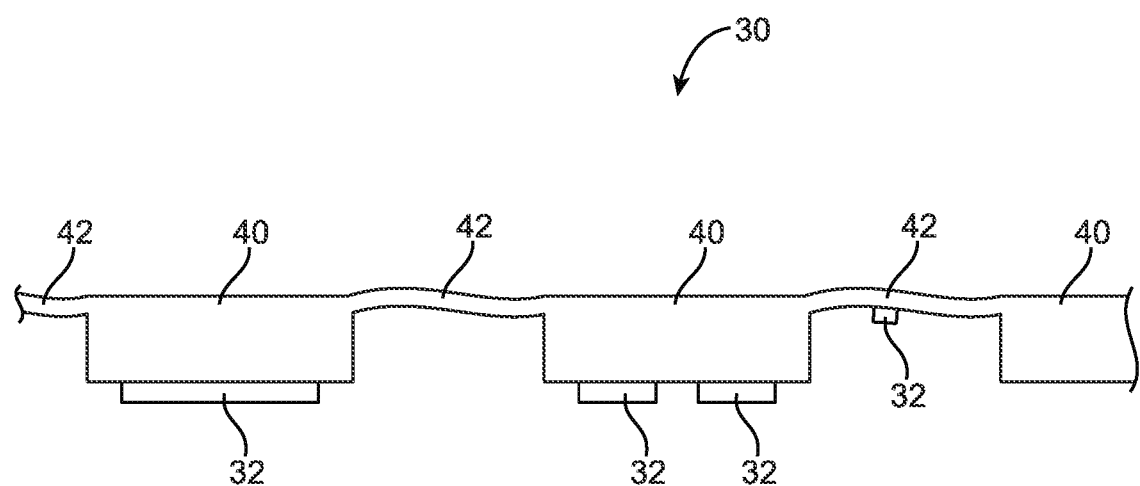
FIG. 5 is a cross-sectional side view of an illustrative rigid flex main logic board having a flexible printed circuit substrate and electronic components in accordance with an embodiment of the present invention.

FIG. 5 shows a cross-sectional side view of a portion of an illustrative printed circuit 30. As shown in FIG. 5, printed circuit 30 may be formed from a rigid-flex circuit having rigid portions such as rigid portions 40 and flexible portions such as flexible portions 42. Flexible portions 42 and rigid portions 40 of printed circuit 30 may include multiple layers. A multi-layer printed circuit such as printed circuit 30 may sometimes be referred to as a printed circuit board (PCB) stack or PCB stack-up.

Layers of printed circuit 30 may be formed from dielectrics such as fiberglass-filled epoxy (e.g., as a rigid layer in a PCB stack) and polyimide (e.g., as a flexible layer in a PCB stack), FR-2 (phenolic cotton paper), FR-3 (cotton paper and epoxy), FR-4 (woven glass and epoxy), FR-5 (woven glass and epoxy), FR-6 (matte glass and polyester), G-10 (woven glass and epoxy), CEM-1 (cotton paper and epoxy), CEM-2 (cotton paper and epoxy), CEM-3 (woven glass and epoxy), CEM-4 (woven glass and epoxy), CEM-5 (woven glass and polyester), paper impregnated with phenolic resin, polystyrene, polyimide, polytetrafluoroethylene (PTFE), plastic, other polymers, ceramics, or other suitable dielectrics.

Layers of printed circuit 30 may include attachment layers such as layers of prepreg (i.e., pre-impregnated layers of fiber and resin). Layers of copper or other conductive materials may be formed on the surfaces of other layers.

Flexible portions 42 may contain patterned conductive traces (e.g., conductive traces on flexible sheets of substrate such as polyimide sheets) that convey signals between rigid portions 40, components such as components 32 or other components of device 10.

Figure 6A:
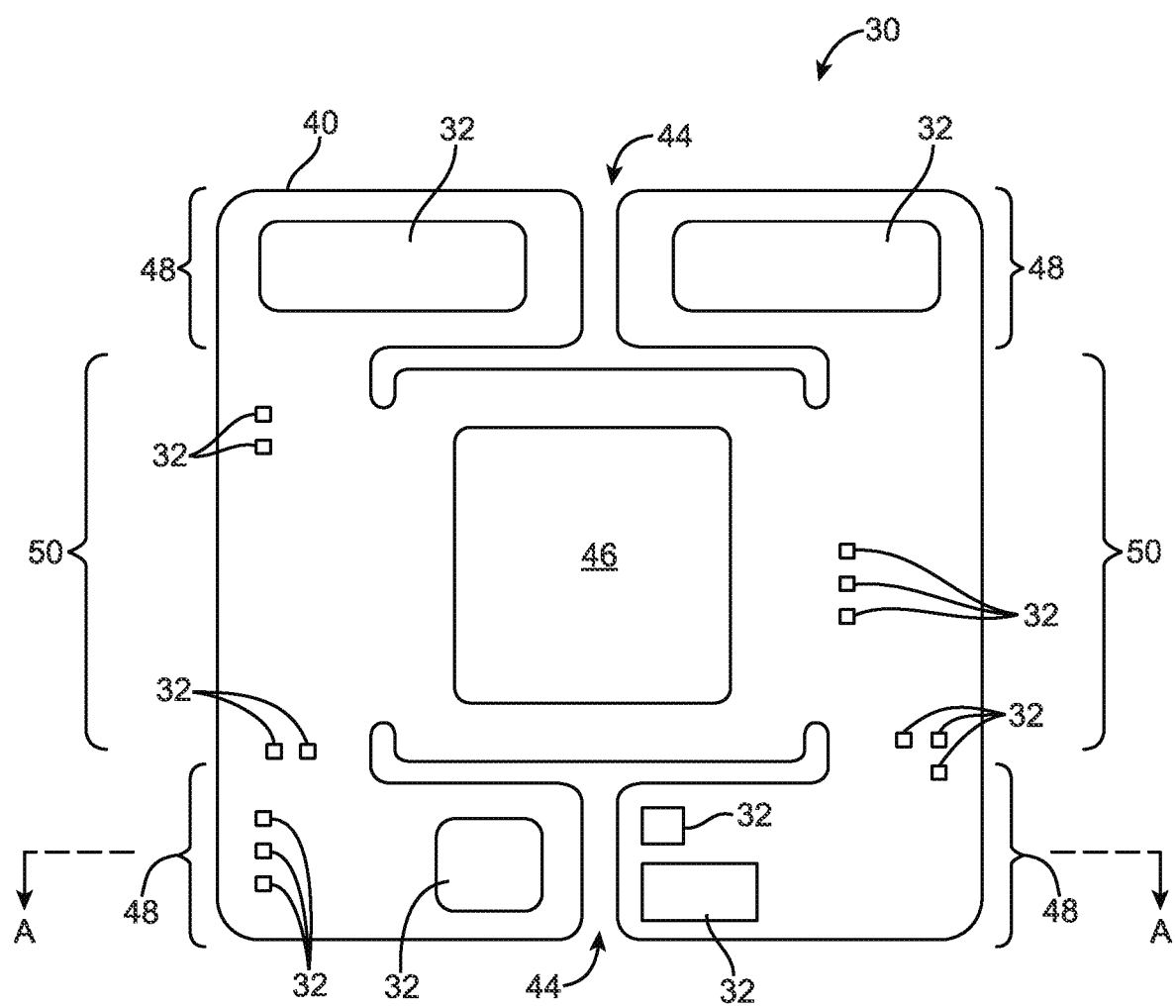
FIG. 6A is a top view of an illustrative main logic board with cutaway portions for providing flexibility in accordance with an embodiment of the present invention.

FIG. 6A shows a top view of an illustrative printed circuit 30 formed from a rigid printed circuit board having openings that allow rigid portions to flex with respect to other rigid portions. As shown in FIG. 6A, printed circuit 30 may be provided with one or more patterned openings such as openings 44. Openings 44 may be cut, etched, machined or otherwise formed in printed circuit 30. In the example of FIG. 6A, printed circuit 30 is formed from a rigid circuit board 40 that has portions such as rigid portions 48 that are configured to flex with respect to other rigid portions such as central rigid portion 50 of printed circuit 30.

As shown in FIG. 6A, rigid central portion 50 may include an integrated circuit such as central processing unit 46. Central processing unit (CPU) 46 may be mounted to rigid central portion 50 to protect CPU 46 from damage due to flexing of printed circuit 30 (e.g., to protect CPU 46 from becoming separated from printed circuit 30). Other components 32 may be mounted to rigid portions 50 and/or rigid portions 48 of printed circuit 30. Rigid central portion 50 may have some internal flexibility. Rigid portions 48 may have relatively more flexibility with respect to rigid central portions 50 than rigid central portion 50 has internal flexibility.

Compliant printed circuit 30 of FIG. 6A formed from a substantially square rigid printed circuit board having openings 44 and CPU 46 mounted in a central portion is merely illustrative. If desired, CPU may be mounted in other positions on printed circuit 30 and printed circuit 30 may have other geometries.

Figure 6B:
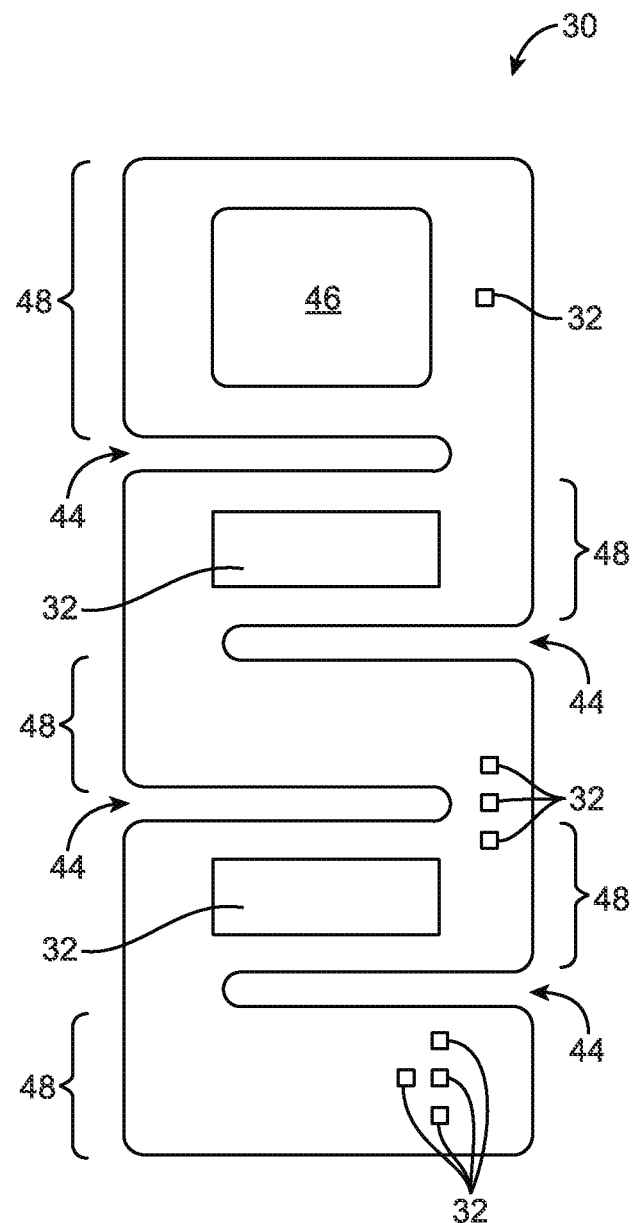
FIG. 6B is a top view of an illustrative elongated main logic board with cutaway portions for providing flexibility in accordance with an embodiment of the present invention.

As an example, FIG. 6B shows an elongated printed circuit 30 formed from a rigid printed circuit board having rigid portions 48 separated by patterned openings as openings 44. As shown in FIG. 6B, CPU 46 may be formed on one of rigid portions 48. Electronic components such as components 32 may be mounted to a common rigid portion 48 with CPU 46 or mounted to other rigid portions 48. Openings 44 of FIGS. 6A and 6B may allow rigid portions 48 to flex with respect to central portion 50 (FIG. 6A) or to other rigid portions 48 (FIGS. 6A and 6B) while rigid portions 48 remain substantially flat as shown in FIG. 7.

Figure 7:
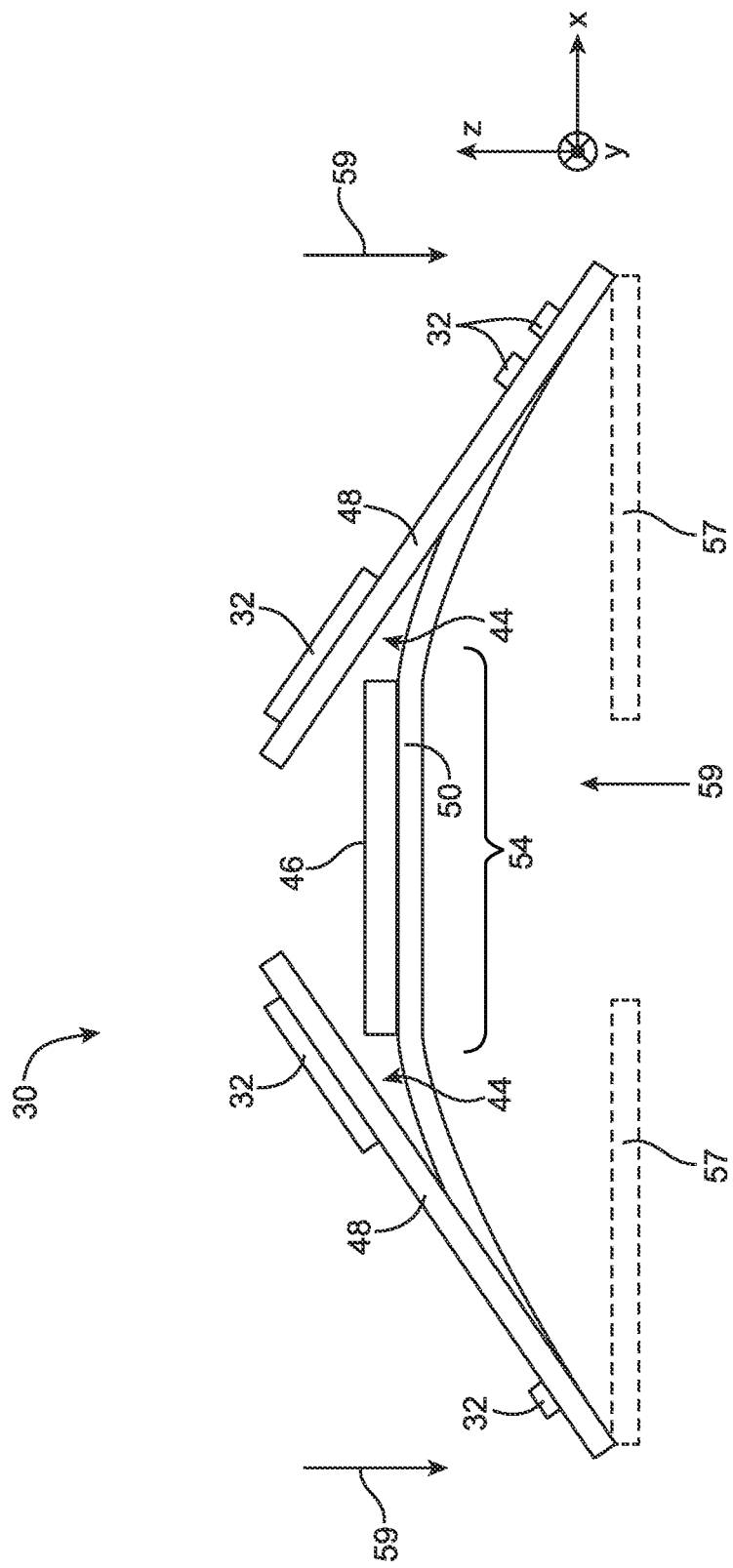
FIG. 7 is a cross-sectional side view of a portion of an illustrative main logic board of the type shown in FIG. 6A with cutaway portions for providing flexibility in accordance with an embodiment of the present invention.

FIG. 7 is a cross-sectional side view of a flexible printed circuit of the type shown in FIG. 6A, taken along line A of FIG. 6A. As shown in FIG. 6A, forces exerted on printed circuit 30 (as indicated by arrows 59) may cause rigid portions 48 of printed circuit 30 to flex with respect to central portion 50. In the presence of these flexing forces, rigid central portion 50 may flex less than rigid portions 48 flex with respect to rigid central portion 50. Rigid central portion 50 may have a rigidity that ensures that portion 54 (e.g., the portion of central portion 50 that includes a mounted circuit such as CPU 46) remains substantially flat.

In the absence of flexing forces, rigid portions 48 may form a portion of a planar printed circuit in an x-y plane (as indicated by dashed lines 57). Under flexing forces such as flexing forces in directions indicated by arrows 59, flexible printed circuit 30 may flex out of the x-y plane. Rigid portions 48 may flex about an axis parallel to the y-axis more than rigid central portion 50 flexes about that axis. Providing a rigid central portion 50 that ensures that portion 54 remains substantially flat may protect CPU 46 from becoming damaged or separated from printed circuit 30.

As shown in FIG. 7, openings such as openings 44 in printed circuit 30 may allow rigid portions 48 to flex with respect to other rigid portions 48 and rigid central portion 50 while each rigid portion 48 remains substantially flat. Providing rigid portions 48 that remain substantially flat while flexing with respect to other portions of printed circuit 30 may protect components such as components 32 from becoming damaged or separated from printed circuit 30 while printed circuit 30 is being flexed or deformed.

Figure 8:
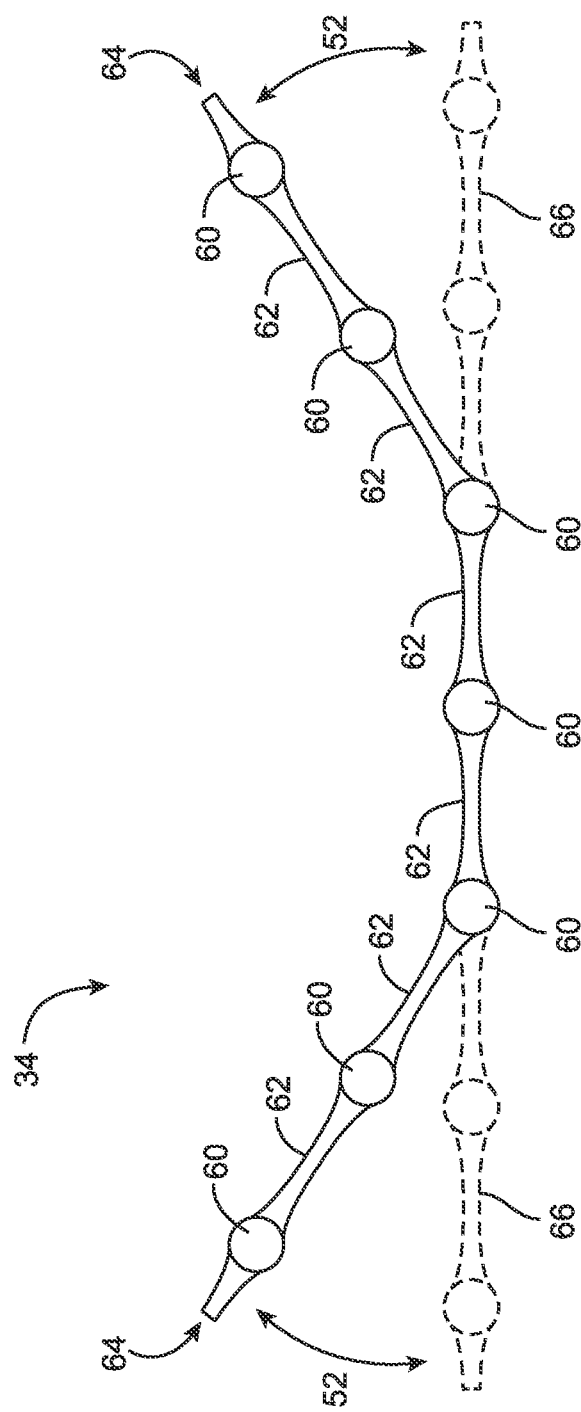
FIG. 8 is a cross-sectional side view of an illustrative flexible battery having flexible and rigid portions in accordance with an embodiment of the present invention.

FIG. 8 shows a cross-sectional side view of a portion of an illustrative flexible battery of the type shown in FIG. 3. As shown in FIG. 8, flexible battery 34 may be designed to flex in a safe and repeatable manner under flexing forces (as indicated by arrows 52). In the example of FIG. 8, flexible battery 34 may include a segmented package of one or more battery cells such as battery cells 60. Battery cells 60 may each be configured to store electric charge for device 10. Battery cells 60 may be connected to each other battery cell 60 or may be coupled directly to a component of device 10 such as a power management unit for delivering electric power to components such as components 32 (see, e.g., FIG. 3) of device 10.

As shown in FIG. 8, battery cells 60 may be attached using flexible members 62. Flexible members 62 may be formed from plastic, silicon or other elastomeric material. Battery cells 60 may each include conductive structures such as conductive anodes and cathodes. Conductive anodes and cathodes in battery cells 60 may be separated by separating layers.

Flexible members 62 may be configured so that battery 34 may flex into a curved position such as curved position 64 under flexing forces in directions indicated by arrows 52. Flexible members 62 may be configured so that flexible battery 34 may be returned to a substantially flat position as indicated by dashed lines 66. In the example of FIG. 8, battery cells 60 may be cylindrical battery cells.

Figure 9:
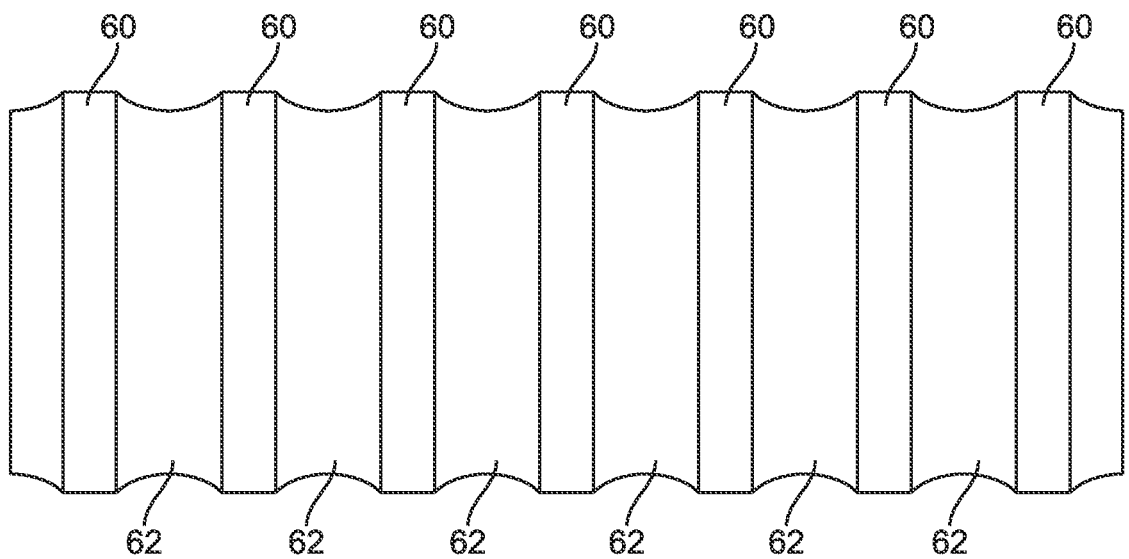
FIG. 9 is a top view of an illustrative flexible battery of the type shown in FIG. 8 having flexible and rigid portions in accordance with an embodiment of the present invention.

FIG. 9 is a top view of a flexible battery of the type shown in FIG. 8. As shown in FIG. 8, cylindrical battery cells 60 may be joined using flexible members 62. In the example of FIGS. 8 and 9, flexible battery 34 may be preferentially flexible about an axis that is parallel to cylindrical members 60. This is merely illustrative. If desired, flexible battery 34 may be configured to allow flexible battery 34 to be flexed in multiple dimensions as shown in FIG. 10.

Figure 10:
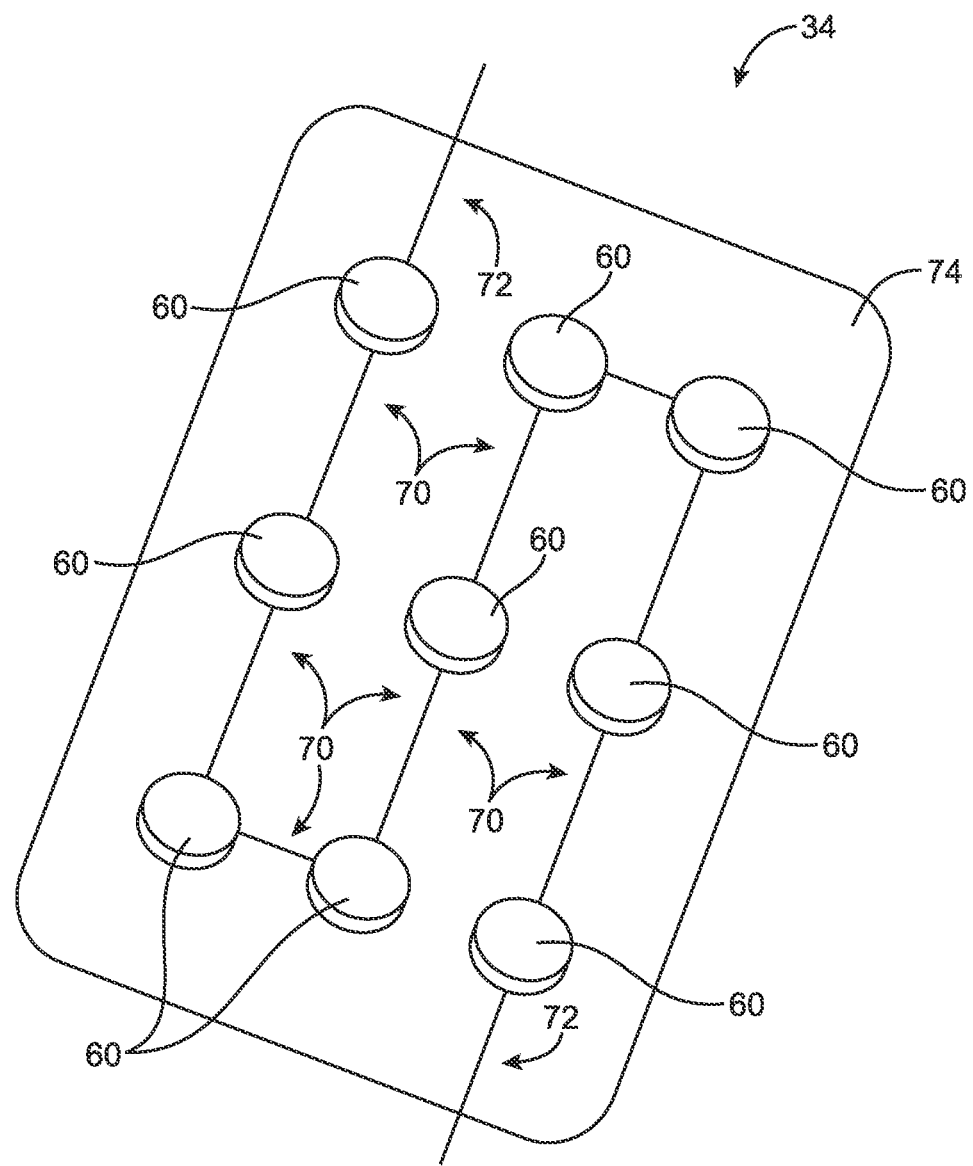
FIG. 10 is a perspective view of an illustrative flexible battery having flexible and rigid portions in accordance with an embodiment of the present invention.

As shown in FIG. 10, battery cells 60 may include one or more coin cells mounted on a sheet of flexible material such as flexible sheet 74. Flexible sheet 74 may be formed from plastic, silicon or other flexible material. If desired, flexible sheet 74 may be implemented using flexible sheets of substrate such as a polyimide sheets. In configurations in which battery 34 is formed from coin cells on a flexible sheet, coin cells may be connected using interconnects 70. Coin cells 60 may be coupled to other device components such as a power management unit using conductive connectors 72.

Conductive connectors 72 and conductive interconnects 70 may be formed from wires, twisted wire pairs, other wires, or may be formed from conductive traces in flexible sheet 74. Coin cells 60 may each include conductive structures such as conductive anodes and cathodes. Conductive anodes and cathodes in battery cells 60 may be separated by dielectric separating layers. Providing device 10 with a battery such a flexible battery 34 having coin cells mounted on a flexible sheet may provide flexibility in multiple dimensions for battery 34 and device 10. The example of FIG. 10 in which flexible battery 34 is formed from coin cells mounted on a flexible sheet is merely illustrative. If desired flexible battery may be formed by with lubricating separator layers (sometimes called slip layers) that allow battery 34 to flex as shown in FIGS. 11 and 12.

Figure 11:
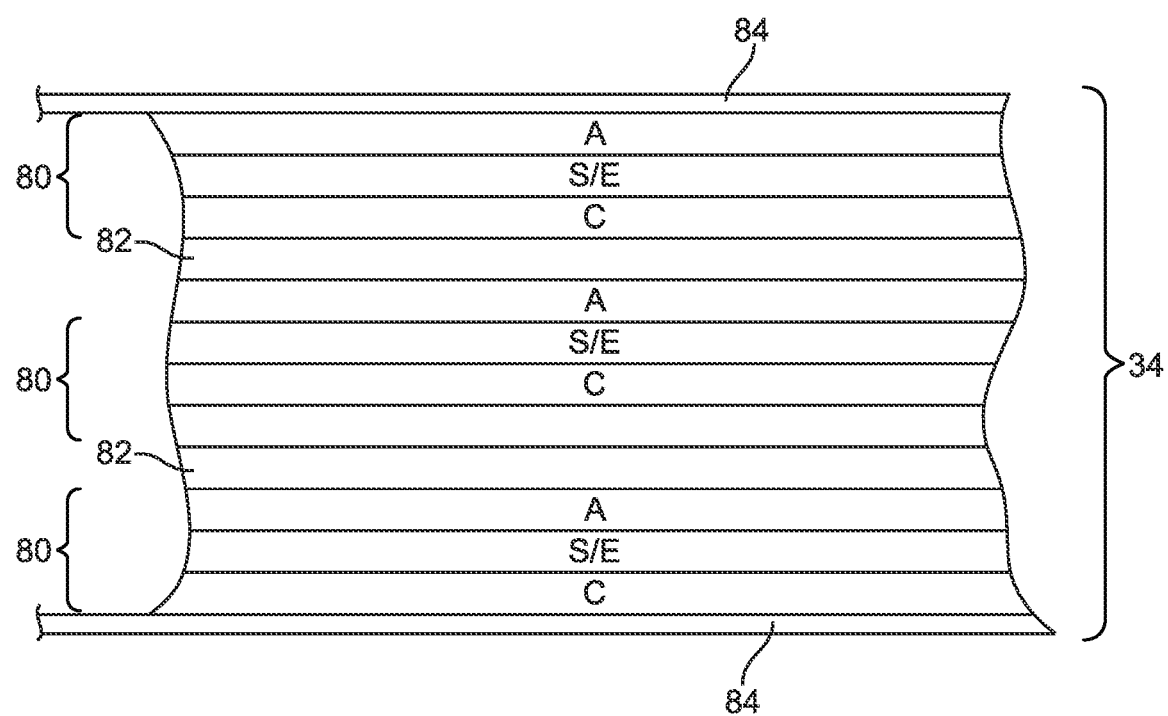
FIG. 11 is a cross-sectional side view of a portion of an illustrative flexible battery in accordance with an embodiment of the present invention.
Figure 12:
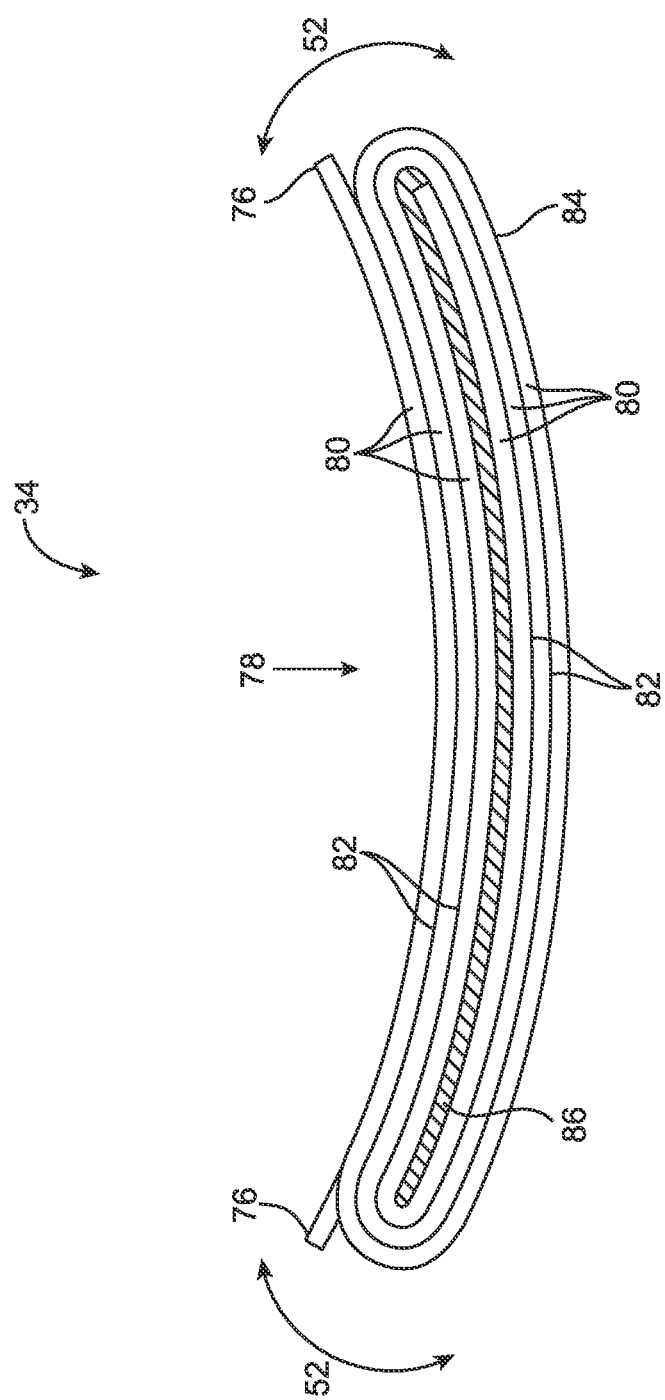
FIG. 12 is a cross-sectional side view of a portion of an illustrative flexible battery having lubricating separator layers in accordance with an embodiment of the present invention.

As shown in FIG. 11, flexible battery 34 may include layers of electrode structures such as layers 80. Layers 80 may include anode and cathode electrodes A and C respectively and separator/electrolyte layers S/E. Cathode layer C may be attached to an upper surface of a separator layer such as separator/electrode layer S/E. Anode layer (e.g., negative electrode layer) A may be attached to an opposing lower surface of a separator layer such as separator layer S/E. The layers of electrode structures 80 are typically thin (e.g., fractions of a millimeter).

Battery 34 may include battery technology such as lithium-ion battery technology, lithium polymer battery technology, or other battery technology. In configurations in which battery 34 is implemented using lithium-ion battery technology, positive electrode C, which is sometimes referred to as the cathode, may include lithium, whereas negative electrode A, which is sometimes referred to as the anode, may contain carbon.

In configurations in which battery 34 is implemented using lithium polymer battery technology, positive and negative electrodes C and A respectively may be laminated to opposing sides of separator layer S/E formed from a polymer separator sheet. For example, a lithium polymer battery may have a positive electrode layer C that is formed from $LiCoO_2$ or $LiMnO_4$, a separator layer S/E that is formed from a polymer such as polyethylene oxide, and a negative electrode layer A that contains lithium or a compound of lithium and carbon (as examples). Other types of electrodes and separators may be used. These are merely illustrative examples.

As shown in FIG. 11, flexible battery 34 may include lubricious separator layers such as slip layers 82. Slip layers 82 may be interposed between electrode structures such as battery layers 80. Providing battery 34 with lubricious separator layers may help layers 80 slide or glide with respect to other layers 80 thereby allowing battery 34 to flex. Lubricious separator 82 may be formed from tetrafluoroethylene, polytetrafluoroethylene (e.g., Teflon®), or other suitable materials. In the example of FIG. 11, every other separator layer in battery 34 is a slip layer such as slip layers 82. This is merely illustrative. If desired, separator layers S/E may be lubricious, every second separator layer between layers 82 may be lubricious, a single lubricious layer may be provided, or other configurations in which battery 34 includes a lubricious layer such as layer 82 are possible.

Separator/electrolyte layers S/E may be an electrolyte gel or electrolyte liquid that allows ions (e.g., electrons, or other charged particles) to flow between positive electrode layers C and A. Lubricious separator layers may, for example, be formed from non-permeable material that prevents the flow of ions such as electrons or other charged particles. Separator layers S/E and lubricious separator layers 82 may be formed from a common material or may be formed from different materials. Slip layers 82 may be more lubricious than separator layers S/E of electrode structures 80.

Electrode structures 80 may be sealed in a battery pouch such as pouch 84. Pouch 84 may, for example, be formed from a polymer that is lined with a metal such as aluminum.

To ensure that battery 34 is formed from electrode structures 80 having sufficient charge storage capacity, the area of electrode structures 80 may be many square centimeters in size (as an example). It may therefore be desirable to fold electrode structures into a more compact shape. For example, it may be desirable to wrap electrode structures into a shape of the type shown in FIG. 12.

This type of electrode configuration, which is sometimes referred to as a jelly-roll shape, reduces the footprint of the battery and provides the battery with a size and shape that is compatible with typical device form factors. This type of electrode configuration may include lubricious layers such as layers 82 that provide glide capability between layers 80 thereby increasing the flexibility of battery 34.

As described above in connection with FIG. 11, layers 80 of battery 34 may include cathode layers C, anode layers A and separator layers S/E that separate the conductive layers. As shown in FIG. 12, layers 80 may be separated from other layers 80 using a lubricious separator layer such as slip layer 82. Providing battery 34 with lubricating separator layers such as slip layer 82 may allow battery 34 to flex under flexing forces in directions such as directions 52 and/or 78.

If desired, additional lubricious material such as material 86 may be provided at the center of wrapped layers 80 of battery 34. Additional lubricious material 86 may provide additional flexibility for battery 34 by further lubricating internal wrapped layers 80 of battery 34. Lubricious material 86 may be formed from the same material as the material that forms slip layers 82 or may be formed from a different material from the material that forms slip layers 82.

In configurations in which flexible battery 34 is includes wrapped cathode/anode/separator layers separated by lubricating separator materials such as lubricious separator 82, battery 34 may be provided with tabs such as tabs 76. Tabs 76 may include engagement members for mounting battery 34 to device structures such as housing 12 or cover layer 14C. Tabs 76 may include conductive connectors for electrically coupling battery 34 to other device circuitry such as a power management unit or printed circuit 30 (see FIG. 3). For example, tabs 76 may include a positive terminal connected to cathode layer C of layer 80 and a negative terminal connected to anode layer A of layer 80. Wrapped layers 80 of battery 34 may be sealed in a pouch such as outer film 84. Outer film 84 may be configured to provide a flexible enclosure for battery 34.

Figure 13:
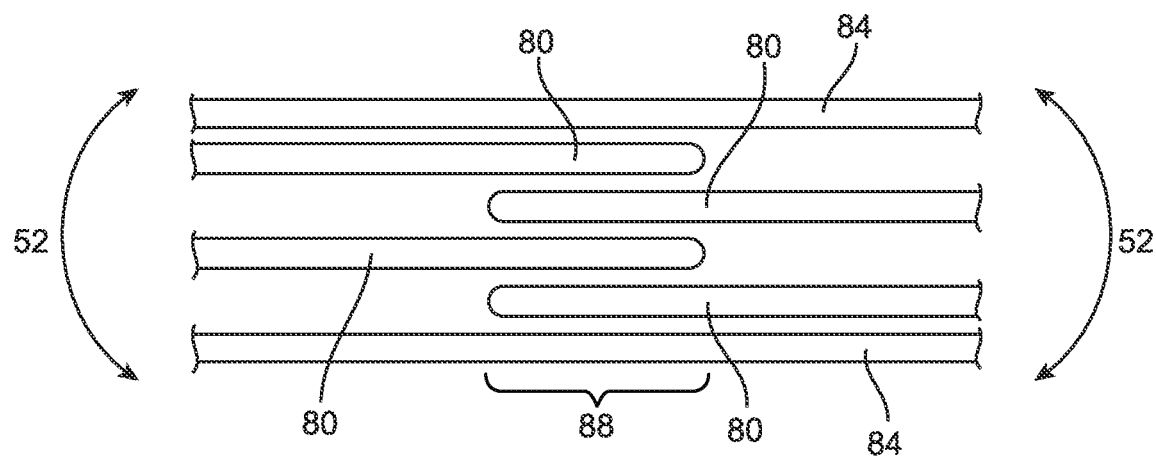
FIG. 13 is a cross-sectional side view of an illustrative flexible battery having interlocking layers in accordance with an embodiment of the present invention.

The example of FIG. 12 in which layers 80 of battery 34 are wrapped to form a jelly-roll battery is merely illustrative. If desired, layers 80 of battery 34 may be mounted in pouch 84 such that layers 80 form an interlocking interface region as shown in FIG. 13. In the example of FIG. 13, an interlocking interface region such as interface region 88 may be provided in which a portion of some layers 80 interlock with a portion of other layers 80. Providing battery 34 with partially interlocking layers 80 as shown in FIG. 13 may allow flexing of battery 34 in interface region 88 due to flexing forces as indicated by arrows 52.

Figure 14:
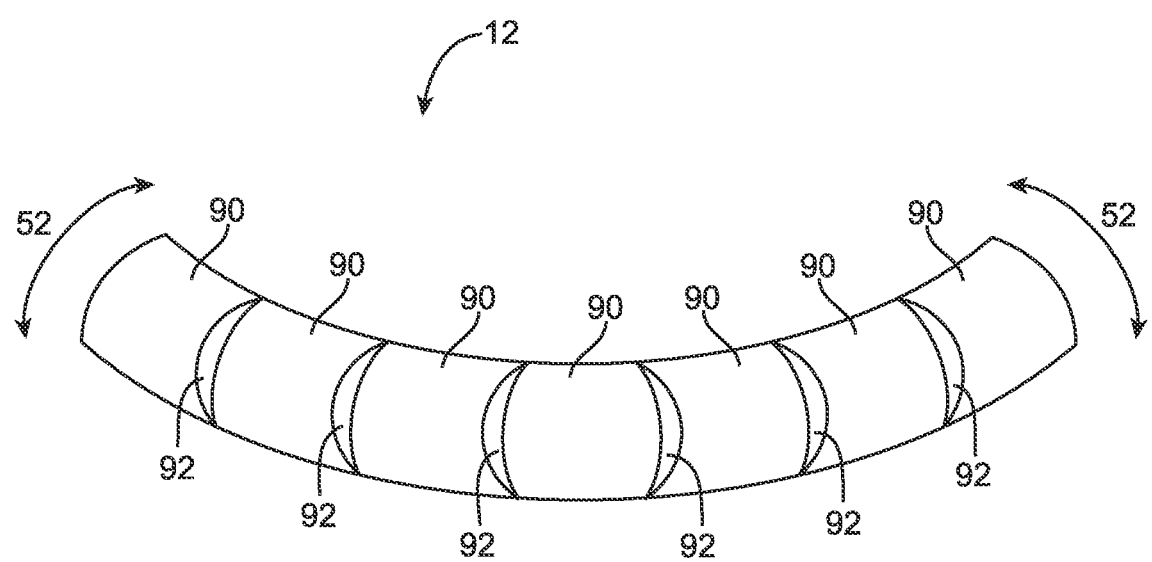
FIG. 14 is a cross-sectional end view of an illustrative flexible housing having flexible and rigid portions in accordance with an embodiment of the present invention.

FIG. 14 shows a cross-sectional end view of an illustrative flexible housing of the type shown in FIG. 3. As shown in FIG. 14, housing 12 may include a segmented housing structure that includes relatively rigid portions such as portions 90 and relatively flexible portions such as portions 92.

Rigid portions 90 may be formed from plastic, glass, ceramics, fiber composites, metal (e.g., stainless steel, aluminum, etc.), fabric, silicone, other suitable materials, or a combination of these materials. Flexible portions 92 may include hinges or other rotating members that attach rigid portions 92 and allow rigid portions 92 to move with respect to other rigid portions 92 under flexing forces as indicated by arrows 52. This is merely illustrative.

If desired, flexible portions 92 may include elastomeric members interposed between rigid portions 90 or may be formed from relatively soft elastomeric material that forms an integrated portion of a single housing structure 12 that includes rigid portions 90 and flexible portions 92. For example, flexible portions 92 may be formed from an elastomeric material such as elastomeric foam, silicone, rubber, silicone rubber, a thermoplastic elastomeric (TPE) such as a thermoplastic polyurethane polymer, etc.

The example of FIG. 14 is merely illustrative. If desired, flexible housing 12 may be formed from a single elastomeric structure or may include a housing structure having a variable cross section for providing varying resistance to flexing as shown in FIGS. 15 and 16.

Figure 15:
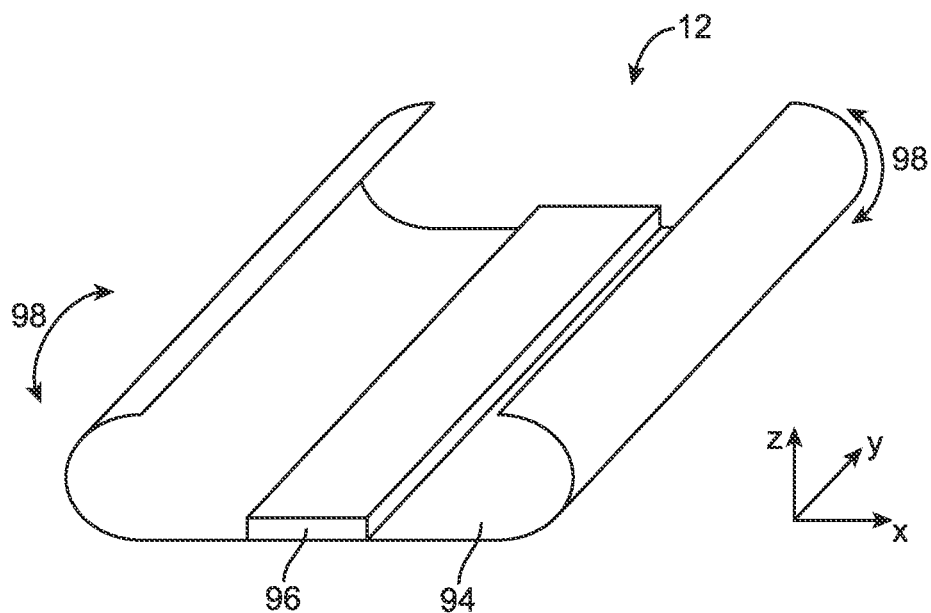
FIG. 15 is a perspective view of an illustrative flexible housing having portions of different flexibility in different dimensions in accordance with an embodiment of the present invention.

FIG. 15 is a perspective view of a housing structure such as housing 12 having a flexible sheet such as flexible sheet 94 (e.g., a thin sheet of flexible plastic, fiber composites, metal, fabric, silicone, other suitable materials, or a combination of these materials) and a rigid support structure such as support structure 96. Support structure 96 may be a relatively thicker material such as carbon fiber, plastic, glass, ceramics, fiber composites, metal (e.g., stainless steel, aluminum, etc.), fabric, silicone, other suitable materials, or a combination of these materials. Flexible sheet 94 may form, for example, a rear wall (e.g., rear wall 12R of FIG. 3) for device 10. Flexible sheet 94 may allow flexing of housing 12 about an axis parallel to the y-axis shown in FIG. 15 (as indicated by arrows 98).

Figure 16:
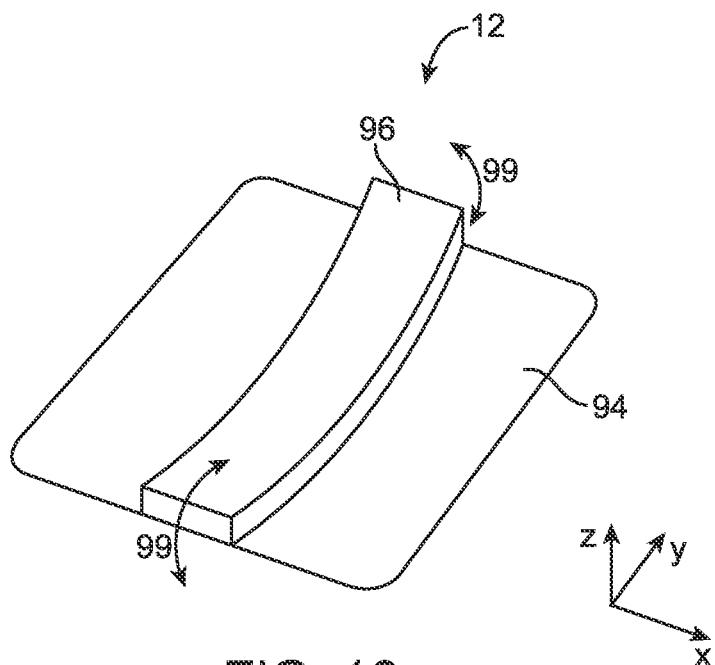
FIG. 16 is a perspective view of an illustrative flexible housing of the type shown in FIG. 15 showing how the flexible housing may be less flexible in one dimension than in a second dimension in accordance with an embodiment of the present invention.

As shown in FIG. 16, support structure 96 may be formed extend along a dimension of flexible sheet 94 along a y-axis that is perpendicular to the x-axis shown in FIGS. 15 and 16. Support structure 96 may therefore provide resistance to flexing about an axis that is parallel to the x-axis shown in FIGS. 15 and 16 (as indicated by arrows 99). Providing housing 12 with flexible sheet 94 and support structure 96 may provide preferential flexibility about an axis that is parallel to the longest dimension of support structure 96. Support structure 96 may have a flexibility that is less than the flexibility of flexible sheet 94.

Figure 17:
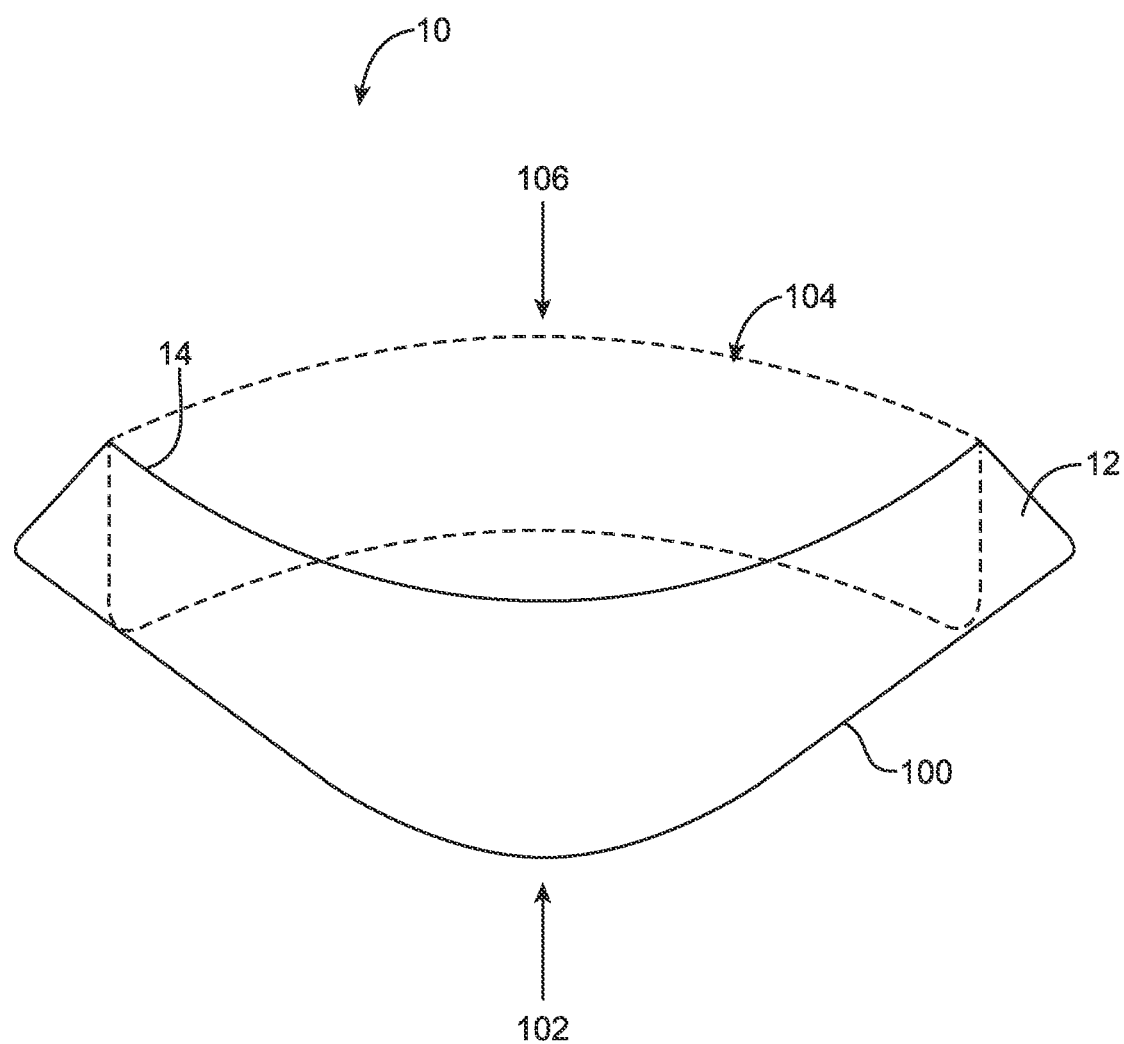
FIG. 17 is a cross-sectional side view of an illustrative bi-stable flexible housing having multiple stable positions in accordance with an embodiment of the present invention.

If desired, housing 12 may be configured to have one or more stable configurations as shown in FIG. 17. In the example of FIG. 17, housing 12 is formed from a bi-stable housing structure having two preferred positions. As shown in FIG. 17, housing 12 may have a stable position such as position 100. Housing 12 may be configured so that, when in position 100, housing 12 remains in position 100 in the absence of external flexing forces.

A user of device 10 may apply a force in direction 102 to housing 12. Housing 12 may be configured to deform in response to the force in direction 102 until housing 12 reaches a second stable position 104. Housing 12 may be configured so that, when in position 104, housing 12 remains in position 104 in the absence of external flexing forces. A user of device 10 may apply a force in direction 106 to device 10. Housing 12 may be configured to deform in response to the force in direction 106 until housing 12 returns to stable position 100.

Providing device 10 with a housing such as housing 12 having more than one stable position may increase the ergonomic usage of device 10 while provide stable positions for resting device 10 on a surface. Providing device 10 with a housing such as housing 12 having more than one stable position may allow a user of device 10 to alter the shape of display 14 from a shape having a concave outer surface (e.g., in position 100) to a shape having convex outer surface (e.g., in position 104). This is merely illustrative. If desired, housing 12 may have more than one stable position, more than two stable positions, more than three stable positions, or may be continuously flexible so that device 10 may be flexed in to any position.

Figure 18:
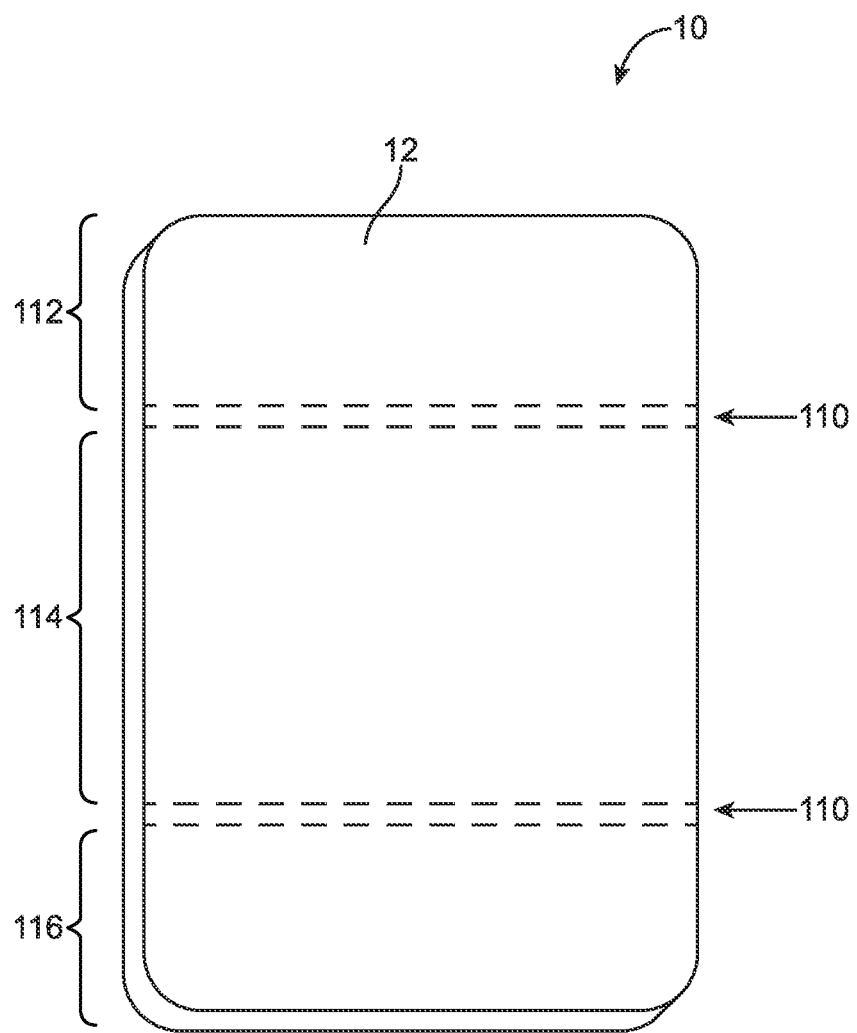
FIG. 18 is a rear perspective view of an illustrative flexible housing having multiple multi-stable portions providing more than two multi-stable positions in accordance with an embodiment of the present invention.

As shown in FIG. 18, housing 12 may include one or more multi-stable regions such as regions 110. Regions 110 may include hinges or other bearings having discrete stable positions, elastomeric materials attached to or integrated into other portions of housing 12, or may include patterned holes, bulges, protrusions, openings or features for providing multi-stable portions 110 with one or more stable positions. Providing housing 12 with one or more multi-stable regions such as regions 110 may allow portions such as top portion 112, central portion 114 and bottom portion 116 to flex separately into multiple stable positions.

Figure 19:
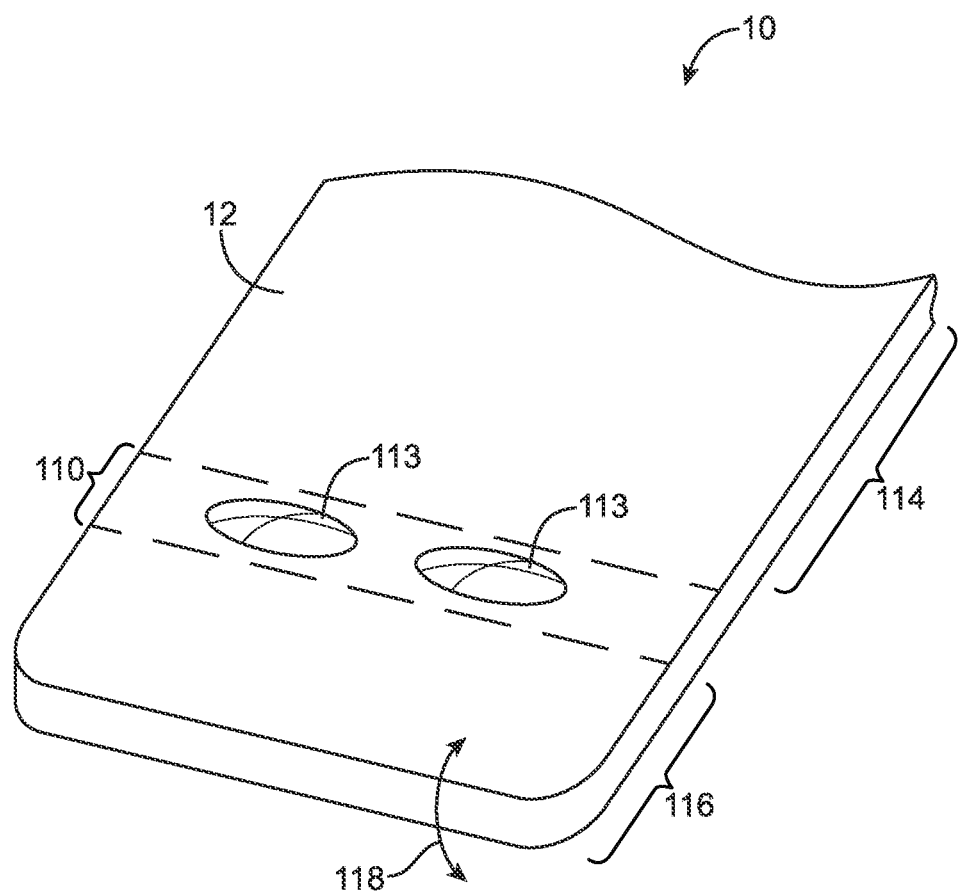
FIG. 19 is a rear perspective view of a portion of an illustrative flexible housing in the vicinity of a bi-stable portion in accordance with an embodiment of the present invention.

FIG. 19 shows an illustrative portion of housing 12 in the vicinity of one of multi-stable regions 110. As shown in FIG. 19, multi-stable regions 110 of housing 12 may include one or more bi-stable protrusions such as bulges 113. Bulges 113 may be bi-stable bulges that have an external (i.e., convex) stable position and an internal (i.e., concave) stable position. Flexing bottom portion 116 as indicated by arrows 118 may cause bulges 113 to "pop" into or out of device 10. Housing 12 may be provided with a stable bent position in the configuration in which bulges 113 bulge inward and another stable bent position in the configuration in which bulges 113 bulge outward of device 10. This is merely illustrative. If desired, housing 12 may be configured to have a shape that allows a bi-stable portion 110 to be formed at any location along a length of housing 12 as shown in FIG. 20.

Figure 20:
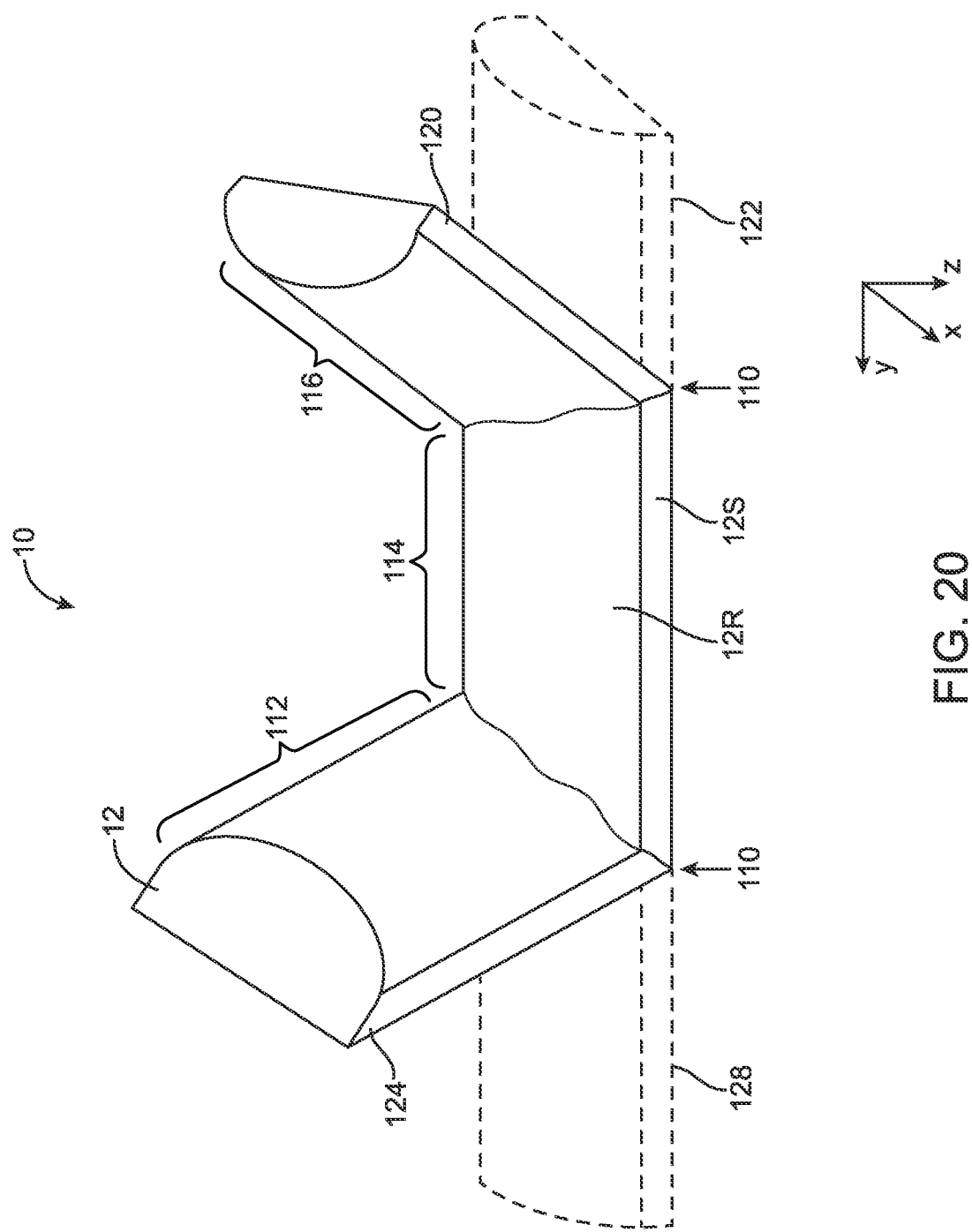
FIG. 20 is an illustrative diagram showing two multi-stable positions of a flexible housing in accordance with an embodiment of the present invention.

FIG. 20 is a perspective rear view of a device having a housing such as housing 12 having a flexible sidewall portion 12S that forms at least a portion of a sidewall for device 10 and a convex rear portion 12R that provides device 10 with a rear enclosure having bi-stable portions 110. As shown in FIG. 20, top portion 112 may be bent from a substantially straight position such as position 128 (in the x-y plane shown in FIG. 20) to a bent position such as position 124 that is out of the x-y plane. Similarly, bottom portion 116 may be bent from a substantially straight position such as position 122 in the x-y plane to a bent position such as position 120. Convex rear surface 12R may provide device 10 with a stable straight configuration (i.e., a configuration in which top portion 112 and bottom portion 116 are in positions 128 and 112 in the x-y plane respectively). Convex rear surface 12 may have one or more multi-stable portions 110 that allow top portion 112 and bottom portion 116 to be flexed (e.g., into positions 124 and 120 respectively) out of the x-y plane about an axis that is parallel to the x-axis.

Figure 21:
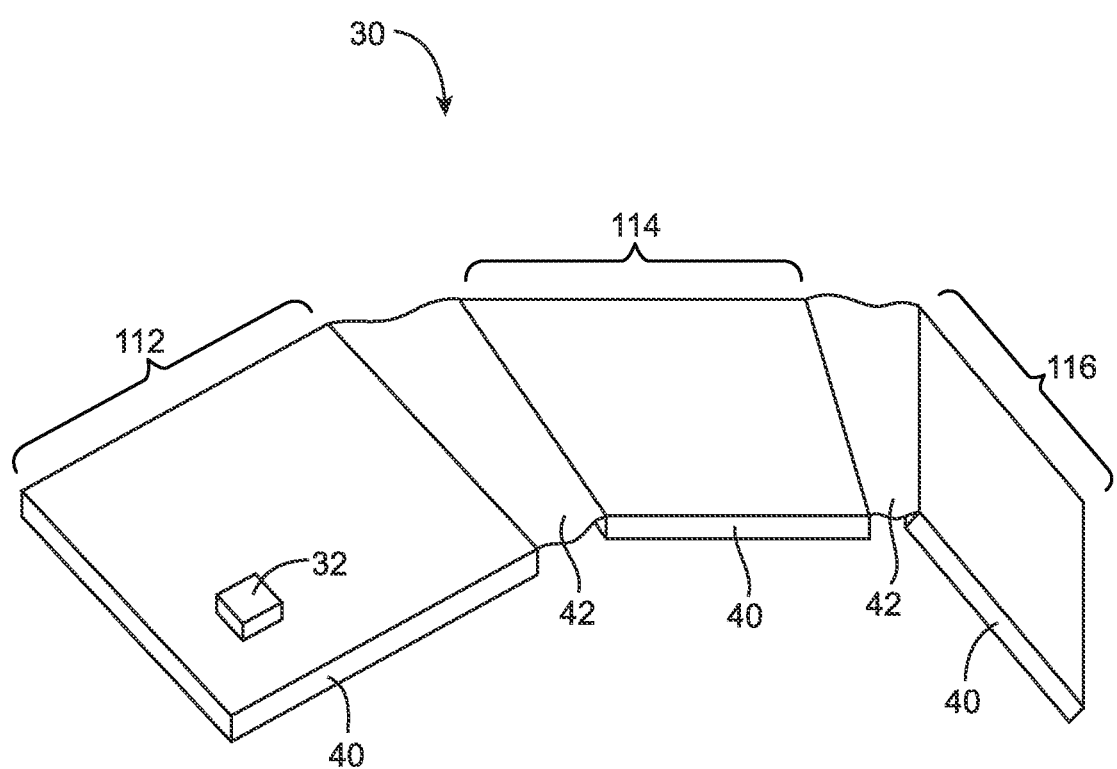
FIG. 21 is a perspective view of a rigid flex printed circuit that may be used in a flexible electronic device having a flexible housing with multiple multi-stable portions in accordance with an embodiment of the present invention.

In order to provide device 10 with flexing capabilities of the type shown in FIG. 20, device 10 may be provided with a printed circuit 30 having rigid portions such as rigid portions 40 that correspond to top portion 112, central portion 114 and bottom portion 116 of device 10 as shown in FIG. 21. As shown in FIG. 21, rigid portions 40 may be connected with flexible portions such as flexible portions 42. Flexible portions 42 may be implemented using flexible printed circuits or may be a flexible polymer for forming a structural connection between rigid portions 40. If desired, flexible portions 42 may contain patterned conductive traces (e.g., conductive traces on flexible sheets of substrate such as polyimide sheets) that convey signals between rigid portions 40, components such as components 32 or other components of device 10.

A device such as device 10 having flexible internal and external components may be flexed into open positions (e.g., for display in information on a flat display), closed positions (e.g., for turning off device 10, for storing device 10, etc.), or partially open positions.

Figure 22:
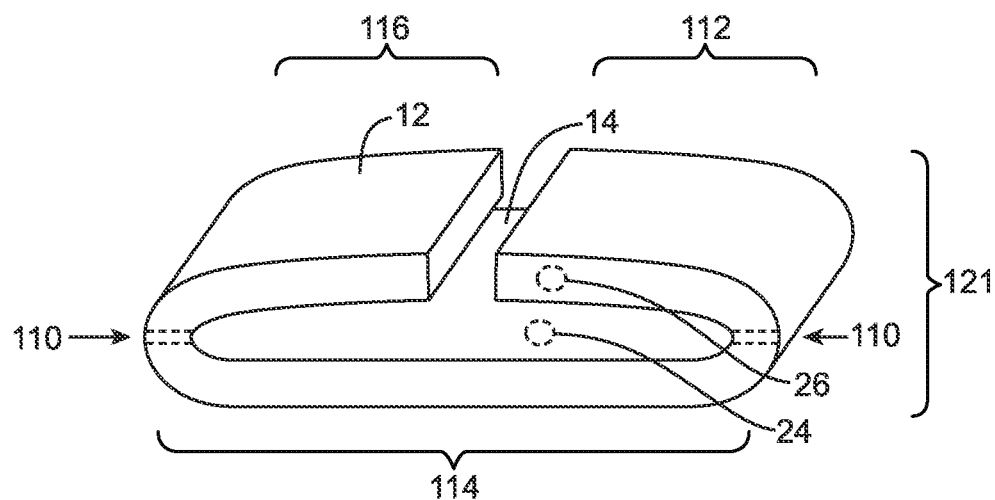
FIG. 22 is a perspective side view of an illustrative flexible electronic device in a tri-folded closed position in accordance with an embodiment of the present invention.

As shown in FIG. 22, flexible device 10 may have a closed position such as closed position 121 in which top portion 112 and bottom portion 116 are folded such that top portions of display 14 on top portion 112 and bottom portion 116 face display 14 of central portion 114 of device 10. Closed position 121 may be used for storing device 10 (e.g., in a pocket). Storing device 10 in a closed position such as closed position 121 may protect display 14 from scratching or other damage. Internal components such as components 24 and 26 may include proximity sensors that sense when another of components 24 or 26 or when another portion of display 14 is nearby. Internal components such as components 24 and 26 may be configured to alter the operational state of device 10 based on proximity data gathered by components 24 and/or 26 (e.g., to turn device 10 off or put device 10 in a sleep or low energy state when in closed position 121).

Figure 23:
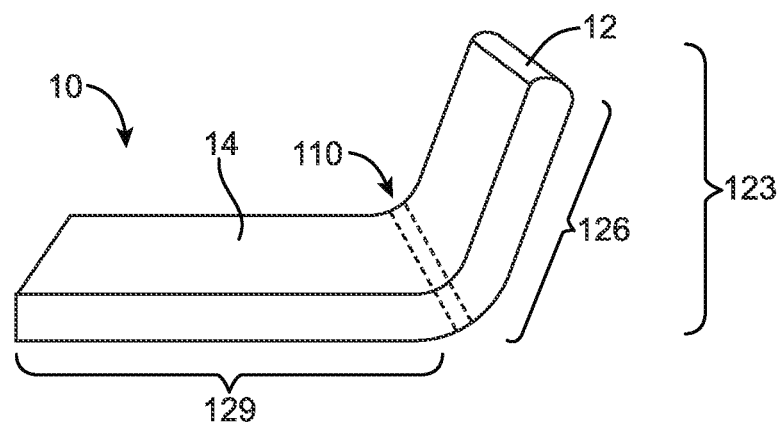
FIG. 23 is a perspective side view of an illustrative flexible electronic device in a partially folded position in accordance with an embodiment of the present invention.

As shown in FIG. 23, flexible device 10 may have a partially open position such as position 123 in which a first portion such as portion 126 of device 10 is bent upward while a second portion such as portion 129 of device 10 is substantially flat. Partially open position 123 may be used for resting device 10 on a surface (e.g., on a desk, table or other surface) while a user views display 14 (e.g., while a user reads text, watches media or other visual output on display 14). Partially open position 123 may provide a more ergonomic position for a user to read text on display 14 while holding device 10 (e.g., while holding device 10 in a position typically used for holding a book, magazine, newspaper or other paper media).

Figure 24:
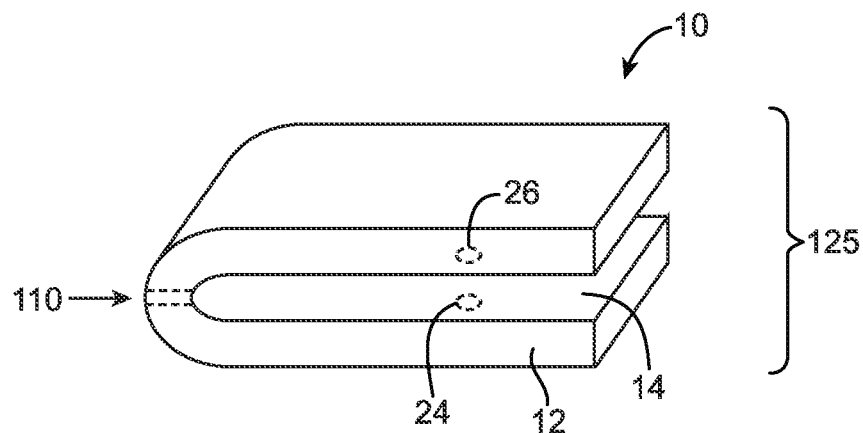
FIG. 24 is a perspective side view of an illustrative flexible electronic device in a folded closed position in accordance with an embodiment of the present invention.

As shown in FIG. 24, flexible device 10 may have a closed position such as closed position 125 in device 10 is folded in half. Closed position 125 may be used for storing device 10 (e.g., in a pocket). Storing device 10 in a closed position such as closed position 120 may protect display 14 from scratching or other damage. Internal components such as components 24 and 26 may include proximity sensors that sense when another of components 24 or 26 or when another portion of display 14 is nearby. Internal components such as components 24 and 26 may be configured to alter the operational state of device 10 based on proximity data (e.g., to turn device 10 off or put device 10 in a sleep or low energy state when in closed position 125).

Figure 25:
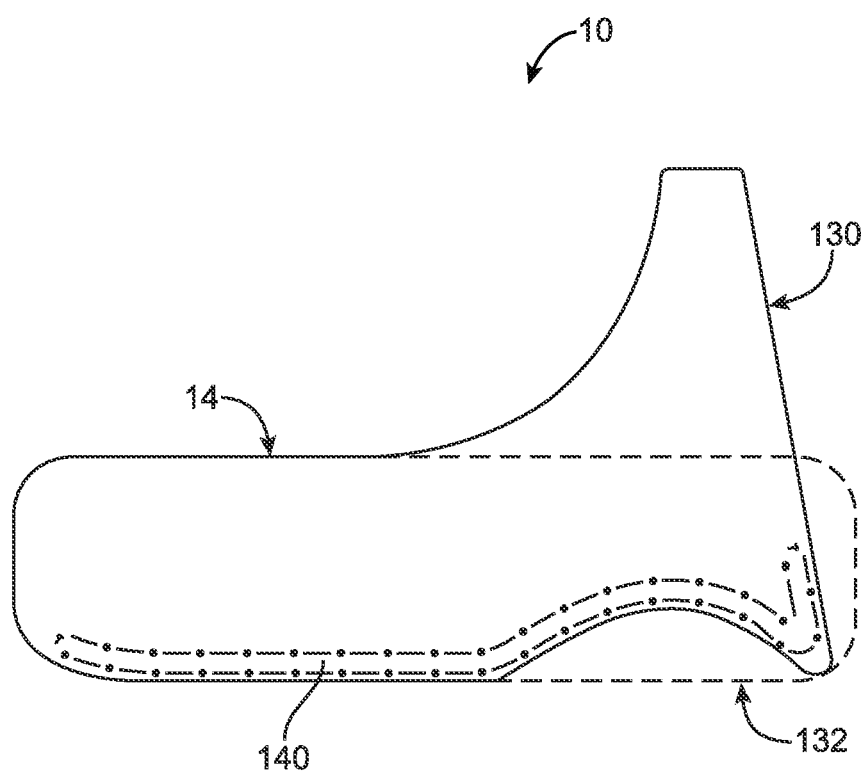
FIG. 25 is a cross-sectional side view of an illustrative flexible electronic device having a flexible expandable housing with multiple stable positions in accordance with an embodiment of the present invention.

If desired, housing 12 may be formed from a fabric or other expandable material and an internal configurable support structure as shown in FIG. 25. As shown in FIG. 25, housing 12 may be configured to have multiple stable positions such as positions 130 and 132. Position 132 may be a substantially flat position. Housing 12 may include an internal configurable support structure such as structure 140 that changes the exterior shape of expandable housing 12 to produce an additional stable position such as position 130. In the example of FIG. 25, housing 12 is expanded by an internal configurable support structure to form a stand that supports device 10 in a partially open position such as position 130. Partially open position 130 may provide a more ergonomic position for a user to read text or view other media on display 14 while resting device 10 (e.g., on a desk, table or other surface) while supporting device 10 with expanded housing 12.

Figure 26:
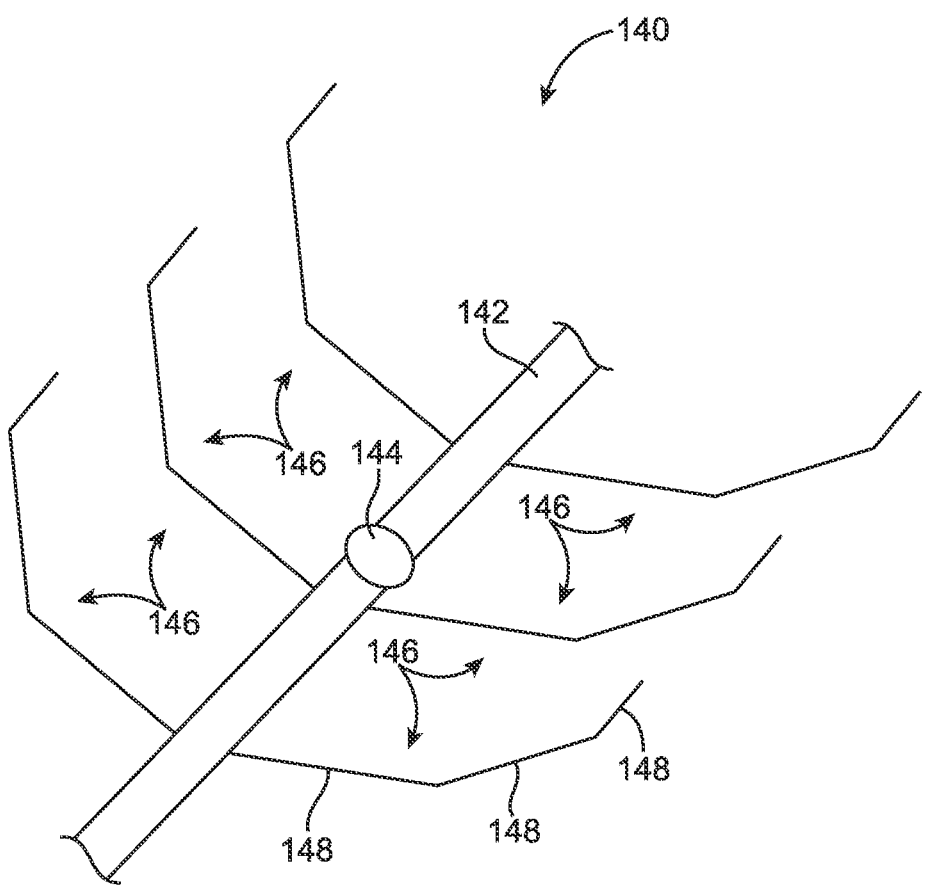
FIG. 26 is a perspective view of an illustrative configurable support member that includes locking spine system for providing flexible and rigid support for a flexible electronic device in accordance with an embodiment of the present invention.

FIG. 26 shows a perspective view of a portion of an illustrative internal configurable support structure that includes an internal locking skeleton for changing the shape or flexibility of housing 12 of the type described above in connection with FIG. 25. As shown in FIG. 26, a configurable support structure such as configurable support structure 140 may include a rigid spine such as spine 142 having a locking hinge such as locking hinge 144 and one or more segmented arms such as arms 146. Locking hinge 144 may be configured to engage (e.g., lock) when spine 142 is twisted, compressed, stretched or otherwise manipulated.

Spine 142 may be manipulated by twisting, squeezing, stretching, compressing or otherwise manipulating housing 12 of device 10 or may be manipulated mechanically or electrically based on user input to device 10 (e.g., using buttons, switches such as switch 15 (FIG. 1), touch-sensitive displays, etc.). Arms 146 may each include one or more segments such as segments 148. Segments 148 may include segments that are formed along sidewalls of housing 12, segments that are formed along rear portions of housing 12 and/or segments formed within other portions of housing 12.

Support 140 may be integrated into housing 12 (e.g., housing 12 may be molded over support 140) or may be attached to housing 12. Engaging hinge 144 may engage arms 146 in a rigid state. Disengaging hinge 144 may disengage arms 146 so that segments 148 may move independently. Engaging and disengaging hinge 144 may therefore alter the physical state of device 10 from flexible to rigid and rigid to flexible respectively. This is merely illustrative. If desired, internal configurable support structure may be formed from pockets of air, gas or liquid in portions of housing 12 as shown in FIG. 27.

Figure 27:
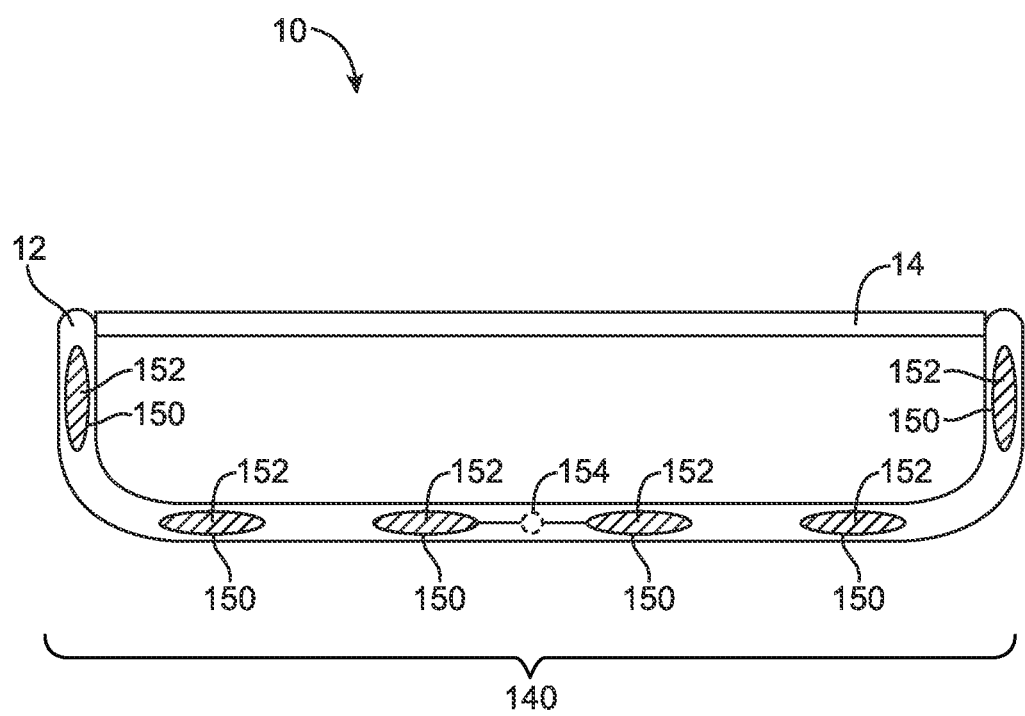
FIG. 27 is a cross-sectional side view of an illustrative flexible housing having a configurable support member that includes a bladder system in accordance with an embodiment of the present invention.

FIG. 27 shows a cross-sectional side view of an illustrative internal configurable support structure that includes a bladder system for changing the shape or flexibility of housing 12 of the type described above in connection with FIG. 25. As shown in FIG. 27, internal configurable support structure 140 may include one or more pockets such as cavities 150 in housing 12.

Cavities 150 may be temporarily or permanently filled with air, fluid, gas or other material such as material 152. Cavities 150 may be coupled to one or more channels 154 for delivering and removing material 152 from cavities 150. Filling cavities 150 with material 152 may cause housing 12 to stiffen thereby providing a rigid housing for device 10. Removing material 152 from cavities 150 may relieve pressure from within cavities 150 and allow housing 12 to become flexible.

Cavities 150 may be filled with material 152 due to exterior mechanical manipulation of housing 12 (e.g., compression or other manipulation of housing 12 by a user of device 10), or due to mechanical or electrical pressurization of material 152 in cavities 150 (e.g., using an electrically powered pump or other pressure regulation device to move material 152 into cavities 150) based on user input to device 10 (e.g., using buttons, switches such as switch 15 (FIG. 1), touch-sensitive displays, etc.). For example, in one configuration, material 152 may be pressurized in cavities 150 by a pressure regulation device in order to stiffen housing 12 (e.g., to form a rigid support structure for housing 12). In another configuration, material 152 may be unpressurized in cavities 150 allowing housing 12 to be deformed. This is merely illustrative.

If desired, cavities 150 may be partially filled with material 152 so that housing 12 may be flexed until material 152 fills the volume of cavities 150. For example, the flexibility of housing 12 may decrease during deformation of housing 12 due to increasing pressure of material 152 in cavities 150 due to compression of cavities 150 due to deformation (flexing) of housing 12. If desired, cavities 150 may be deformable cavities that conform to the shape of a user's hand or body (e.g., while device 10 is stored in a pocket). Deformable cavities may enhance the ergonomic features of device 10.

Filling and emptying cavities 150 may therefore alter the physical state of device 10 from flexible to rigid and rigid to flexible respectively.

The foregoing is merely illustrative of the principles of this invention and various modifications can be made by those skilled in the art without departing from the scope and spirit of the invention.

What is claimed is:

1. An electronic device, comprising:
   a housing;
   a flexible display in the housing, wherein the flexible display is operable in a folded state and an unfolded state;
   a rigid cover layer overlapping the flexible display;
   a magnetic sensor configured to detect whether the flexible display is in the folded state or the unfolded state; and
   control circuitry configured to change an operational state of the electronic device based on information from the magnetic sensor.

2. The electronic device defined in claim 1 wherein the flexible display has first and second portions and wherein the first portion bends behind the second portion in the folded state.

3. The electronic device defined in claim 1 wherein the control circuitry is configured to place the flexible display in a sleep state in response to the information from the magnetic sensor.

4. The electronic device defined in claim 1 further comprising a printed circuit in the housing, wherein the printed circuit comprises a rigid portion and a flexible portion.

5. The electronic device defined in claim 4 wherein the flexible display is configured to fold along an axis and wherein the flexible portion overlaps the axis.

6. The electronic device defined in claim 1 further comprising a flexible battery.

7. The electronic device defined in claim 6 wherein the flexible battery comprises segmented battery cells joined by flexible members.

8. The electronic device defined in claim 1 further comprising a locking hinge configured to restrict movement of the housing.

9. The electronic device defined in claim 1 further comprising:
   a touch sensor configured to receive touch input; and
   control circuitry configured to adjust a shape of the housing in response to the touch input.

10. An electronic device, comprising:
    an expandable housing;
    a locking hinge, wherein:
      when the locking hinge is engaged, the expandable housing is fixed in a first position, and
      when the locking hinge is not engaged, the expandable housing is free to move out of the first position; and
    a flexible display mounted to the expandable housing.

11. The electronic device defined in claim 10 further comprising:
    a magnetic sensor; and
    control circuitry configured to adjust an operational state of the flexible display in response to information from the magnetic sensor.

12. The electronic device defined in claim 10 further comprising:
    a touch sensor configured to receive touch input; and
    control circuitry configured to adjust a shape of the expandable housing in response to the touch input.

13. The electronic device defined in claim 10 further comprising:
    a printed circuit having rigid and flexible portions, wherein the flexible portion overlaps a fold axis of the flexible display.

14. The electronic device defined in claim 10 further comprising a flexible battery having cylindrical battery cells.

15. An electronic device, comprising:
    a housing operable in an open position and a closed position;
    a touch-sensitive flexible display configured to receive touch input; and
    control circuitry configured to adjust a shape of the housing in response to the touch input.

16. The electronic device defined in claim 15 further comprising:
    a magnetic sensor; and
    control circuitry configured to change an operational state of the touch-sensitive flexible display in response to information from the magnetic sensor.

17. The electronic device defined in claim 15 further comprising a locking hinge configured to adjust a flexibility of the housing.

18. The electronic device defined in claim 17 wherein when the locking hinge is engaged, movement of the housing is restricted.

19. The electronic device defined in claim 15 further comprising:
    a printed circuit having rigid and flexible portions, wherein the flexible portion overlaps a fold axis of the touch-sensitive flexible display.

* * * * *